(12) United States Patent
Peterson et al.

(10) Patent No.: US 11,751,462 B1
(45) Date of Patent: Sep. 5, 2023

(54) DEVICES WITH DISPLAYS HAVING TRANSPARENT OPENINGS AND TOUCH SENSOR METAL

(71) Applicant: Apple Inc., Cupertino, CA (US)

(72) Inventors: Ricardo A Peterson, Mountain View, CA (US); Abbas Jamshidi Roudbari, Saratoga, CA (US); Ashray Vinayak Gogte, Campbell, CA (US); Christophe Blondin, Sunnyvale, CA (US); Sebastian Knitter, San Francisco, CA (US); Warren S Rieutort-Louis, Cupertino, CA (US); Yuchi Che, Santa Clara, CA (US); Yurii Morozov, Santa Clara, CA (US); Matthew D Hollands, San Francisco, CA (US); Chuang Qian, San Jose, CA (US); Michael H Lim, Sunnyvale, CA (US); Matthew J Schwendeman, San Francisco, CA (US); Kenny Kim, San Jose, CA (US); Tsung-Ting Tsai, San Jose, CA (US); Yue Qu, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/842,357

(22) Filed: Jun. 16, 2022

Related U.S. Application Data

(60) Provisional application No. 63/315,432, filed on Mar. 1, 2022.

(51) Int. Cl.
*H10K 59/40* (2023.01)
*H10K 59/131* (2023.01)
*H10K 59/35* (2023.01)

(52) U.S. Cl.
CPC ........... *H10K 59/40* (2023.02); *H10K 59/131* (2023.02); *H10K 59/352* (2023.02)

(58) Field of Classification Search
CPC ...... H10K 59/40; H10K 59/131; H10K 59/00; H10K 77/111; H10K 71/00; G09G 3/3258; G09G 3/3266
See application file for complete search history.

(56) References Cited

U.S. PATENT DOCUMENTS

| | | | |
|---|---|---|---|
| 7,355,606 | B2 | 4/2008 | Paquette |
| 7,473,924 | B2 | 1/2009 | Millard et al. |

(Continued)

FOREIGN PATENT DOCUMENTS

WO    2020219267 A1    10/2020

*Primary Examiner* — Sardis F Azongha
(74) *Attorney, Agent, or Firm* — Treyz Law Group, P.C.; Joseph F. Guihan

(57) ABSTRACT

A display may have both a full pixel density region and a pixel removal region with a plurality of high-transmittance areas that overlap an optical sensor. Each high-transmittance area may be devoid of thin-film transistors and other display components. To improve transmission while maintaining satisfactory touch sensing performance, one or more segments of the touch sensor metal in the pixel removal region may have a reduced width relative to the touch sensor metal in the full pixel density region and/or one or more segments of the touch sensor metal in the pixel removal region may be omitted relative to the touch sensor metal in the full pixel density region. To mitigate a different appearance between the pixel removal region and the full pixel density region at off-axis viewing angles, the position of the touch sensor metal in the pixel removal region may be tuned.

26 Claims, 19 Drawing Sheets

(56) References Cited

U.S. PATENT DOCUMENTS

| | | |
|---|---|---|
| 7,781,979 B2 | 8/2010 | Lys |
| 7,940,457 B2 | 5/2011 | Jain et al. |
| 8,531,118 B2 | 9/2013 | Miskin et al. |
| 8,724,942 B2 | 5/2014 | Logunov et al. |
| 9,098,136 B2 | 8/2015 | Kim |
| 9,286,832 B2 | 3/2016 | Park et al. |
| 10,268,884 B2 | 4/2019 | Jones et al. |
| 11,067,884 B2 | 7/2021 | Chen et al. |
| 11,075,353 B2 | 7/2021 | Hou |
| 11,429,235 B2 * | 8/2022 | Kim ............... H10K 59/131 |
| 11,543,903 B2 * | 1/2023 | Huang ............. G06F 3/0445 |
| 2014/0375704 A1 | 12/2014 | Bi et al. |
| 2015/0241705 A1 | 8/2015 | Abovitz et al. |
| 2017/0116934 A1 | 4/2017 | Tien et al. |
| 2019/0034010 A1 | 1/2019 | Lee et al. |
| 2019/0041658 A1 | 2/2019 | Gollier et al. |
| 2019/0094541 A1 | 3/2019 | Choi et al. |
| 2020/0066809 A1 | 2/2020 | Liu |
| 2020/0203450 A1 | 6/2020 | Lou et al. |
| 2021/0064187 A1 | 3/2021 | Lee et al. |
| 2021/0193754 A1 * | 6/2021 | Han ............... H10K 59/122 |
| 2021/0336225 A1 | 10/2021 | Ke |
| 2021/0376047 A1 | 12/2021 | Xue et al. |
| 2022/0328568 A1 * | 10/2022 | Yu ............. H10K 59/80515 |
| 2022/0406851 A1 * | 12/2022 | Lee ............... H10K 59/122 |

* cited by examiner

DEVICES WITH DISPLAYS HAVING TRANSPARENT OPENINGS AND TOUCH SENSOR METAL

This application claims the benefit of provisional patent application No. 63/315,432, filed Mar. 1, 2022, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

There is a trend towards borderless electronic devices with a full-face display. These devices, however, may still need to include sensors such as cameras, ambient light sensors, and proximity sensors to provide other device capabilities. Since the display now covers the entire front face of the electronic device, the sensors will have to be placed under the display stack. In practice, however, the amount of light transmission through the display stack is very low (i.e., the transmission might be less than 20% in the visible spectrum), which severely limits the sensing performance under the display.

It is within this context that the embodiments herein arise.

SUMMARY

An electronic device may include a display and an optical sensor formed underneath the display. The display may have both a full pixel density region and a partial pixel density region or pixel removal region. The pixel removal region includes a plurality of high-transmittance areas that overlap the optical sensor. Each high-transmittance area may be devoid of thin-film transistors and other display components. The plurality of high-transmittance areas regions is configured to increase the transmittance of light through the display to the sensor. The high-transmittance areas may therefore be referred to as transparent windows in the display.

To increase transmittance in the pixel removal region, the arrangement of touch sensor metal in the pixel removal region may be different than the arrangement of touch sensor metal in the full pixel density region. In particular, the touch sensor metal in the pixel removal region may have a lower total coverage per unit area than in the full pixel density region.

To improve transmission while maintaining satisfactory touch sensing performance, one or more segments of the touch sensor metal in the pixel removal region may have a reduced width relative to the touch sensor metal in the full pixel density region and/or one or more segments of the touch sensor metal in the pixel removal region may be omitted relative to the touch sensor metal in the full pixel density region.

To mitigate a different appearance between the pixel removal region and the full pixel density region at off-axis viewing angles, the position of the touch sensor metal in the pixel removal region may be tuned. Some of the touch sensor metal segments in the pixel removal region may be shifted towards or away from their adjacent pixel.

DETAILED DESCRIPTION

Figure 1:
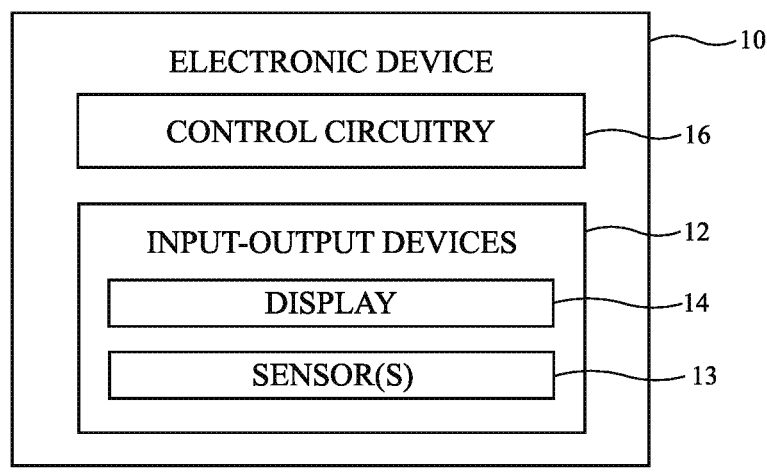
FIG. 1 is a schematic diagram of an illustrative electronic device having a display and one or more sensors in accordance with various embodiments.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Input-output devices 12 may also include one or more sensors 13 such as force sensors (e.g., strain gauges, capacitive force sensors, resistive force sensors, etc.), audio sensors such as microphones, touch and/or proximity sensors such as capacitive sensors (e.g., a two-dimensional capacitive touch sensor associated with a display and/or a touch sensor that forms a button, trackpad, or other input device not associated with a display), and other sensors. In accordance with some embodiments, sensors 13 may include optical sensors such as optical sensors that emit and detect light (e.g., optical proximity sensors such as transreflective optical proximity structures), ultrasonic sensors, and/or other touch and/or proximity sensors, monochromatic and color ambient light sensors, image sensors, fingerprint sensors, temperature sensors, proximity sensors and other sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 13 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

Display 14 may be an organic light-emitting diode display, an array of discrete light-emitting diodes (microLEDs) each formed from a crystalline semiconductor die, or may be a display based on other types of display technology (e.g., liquid crystal displays). Device configurations in which display 14 is an organic light-emitting diode display are sometimes described herein as an example. This is, however, merely illustrative. Any suitable type of display may be used, if desired. In general, display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
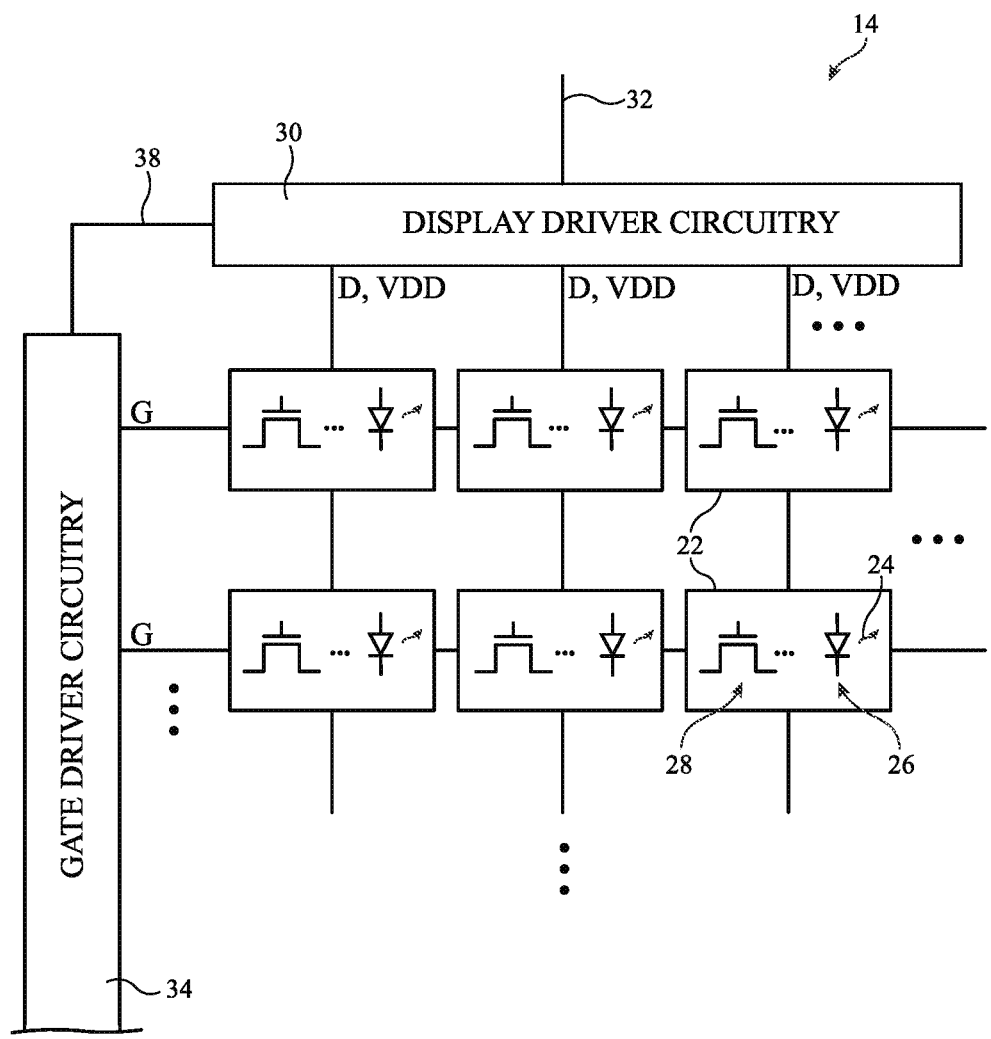
FIG. 2 is a schematic diagram of an illustrative display with light-emitting elements in accordance with various embodiments.

A top view of a portion of display 14 is shown in FIG. 2. As shown in FIG. 2, display 14 may have an array of pixels 22 formed on a substrate. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may include a light-emitting diode 26 that emits light 24 under the control of a pixel control circuit formed from thin-film transistor circuitry such as thin-film transistors 28 and thin-film capacitors. Thin-film transistors 28 may be polysilicon thin-film transistors, semiconducting-oxide thin-film transistors such as indium zinc gallium oxide (IGZO) transistors, or thin-film transistors formed from other semiconductors. Pixels 22 may contain light-emitting diodes of different colors (e.g., red, green, and blue) to provide display 14 with the ability to display color images or may be monochromatic pixels.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply display driver circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14.

Gate driver circuitry 34 (sometimes referred to as row control circuitry) may be implemented as part of an integrated circuit and/or may be implemented using thin-film transistor circuitry. Horizontal control lines G in display 14 may carry gate line signals such as scan line signals, emission enable control signals, and other horizontal control signals for controlling the display pixels 22 of each row. There may be any suitable number of horizontal control signals per row of pixels 22 (e.g., one or more row control signals, two or more row control signals, three or more row control signals, four or more row control signals, etc.).

The region on display 14 where the display pixels 22 are formed may sometimes be referred to herein as the active area. Electronic device 10 has an external housing with a peripheral edge. The region surrounding the active area and within the peripheral edge of device 10 is the border region. Images can only be displayed to a user of the device in the active region. It is generally desirable to minimize the border region of device 10. For example, device 10 may be provided with a full-face display 14 that extends across the entire front face of the device. If desired, display 14 may also wrap around over the edge of the front face so that at least part of the lateral edges and/or at least part of the back surface of device 10 is used for display purposes.

Figure 3:
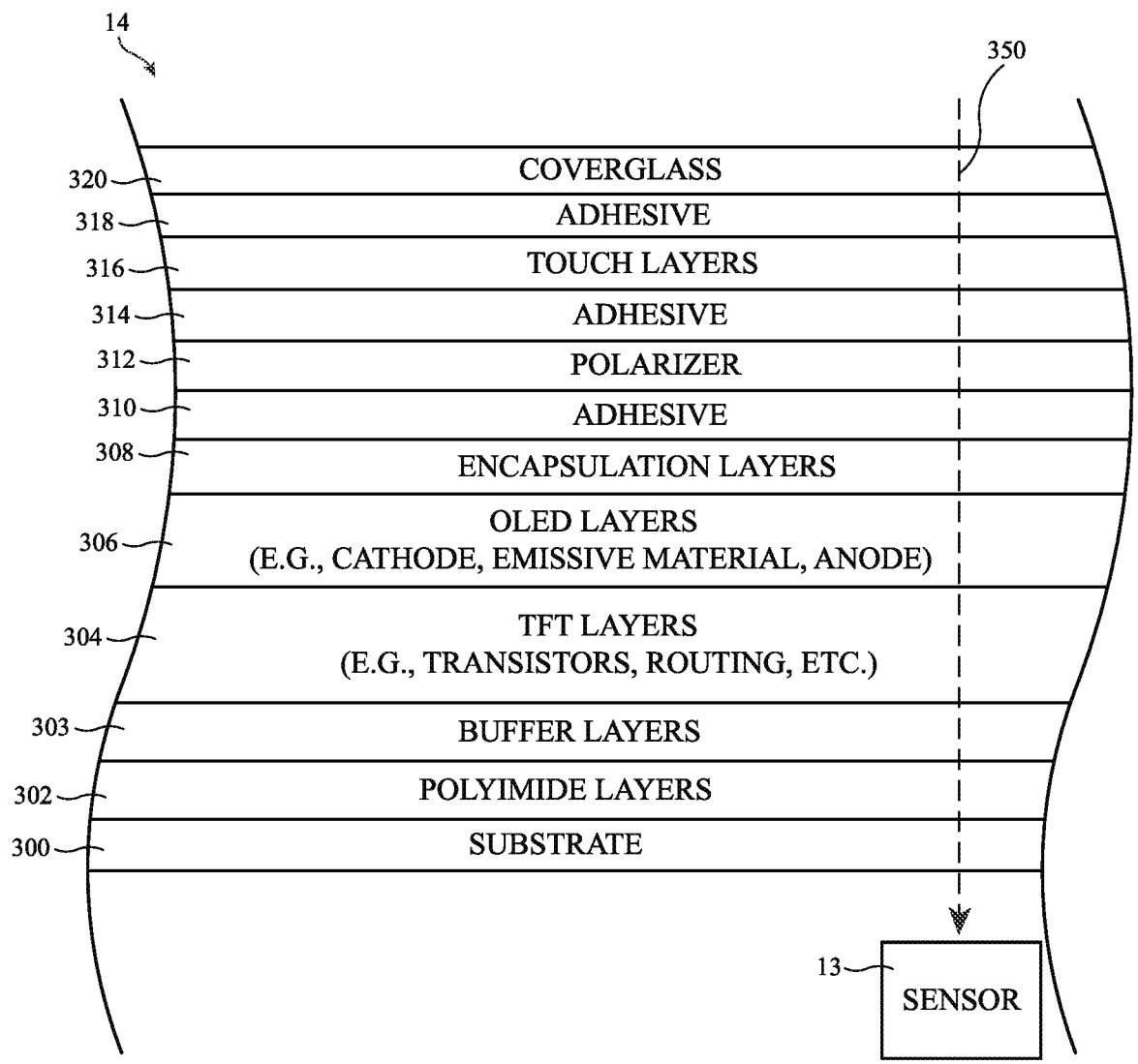
FIG. 3 is a cross-sectional side view of an illustrative display stack that at least partially covers a sensor in accordance with various embodiments.

Device 10 may include a sensor 13 mounted behind display 14 (e.g., behind the active area of the display). FIG. 3 is a cross-sectional side view of an illustrative display stack of display 14 that at least partially covers a sensor in accordance with an embodiment. As shown in FIG. 3, the display stack may include a substrate such as substrate 300. Substrate 300 may be formed from glass, metal, plastic, ceramic, sapphire, or other suitable substrate materials. In some arrangements, substrate 300 may be an organic substrate formed from polyethylene terephthalate (PET) or polyethylene naphthalate (PEN) (as examples). One or more polyimide (PI) layers 302 may be formed over substrate 300. The polyimide layers may sometimes be referred to as an organic substrate (e.g., substrate 300 is a first substrate layer and substrate 302 is a second substrate layer). The surface of substrate 302 may optionally be covered with one or more buffer layers 303 (e.g., inorganic buffer layers such as layers of silicon oxide, silicon nitride, amorphous silicon, etc.).

Thin-film transistor (TFT) layers 304 may be formed over inorganic buffer layers 303 and organic substrates 302 and 300. The TFT layers 304 may include thin-film transistor circuitry such as thin-film transistors, thin-film capacitors, associated routing circuitry, and other thin-film structures formed within multiple metal routing layers and dielectric layers. Organic light-emitting diode (OLED) layers 306 may be formed over the TFT layers 304. The OLED layers 306 may include a diode cathode layer, a diode anode layer, and emissive material interposed between the cathode and anode layers. The OLED layers may include a pixel definition layer that defines the light-emitting area of each pixel. The TFT circuitry in layer 304 may be used to control an array of display pixels formed by the OLED layers 306.

Circuitry formed in the TFT layers 304 and the OLED layers 306 may be protected by encapsulation layers 308. As an example, encapsulation layers 308 may include a first inorganic encapsulation layer, an organic encapsulation layer formed on the first inorganic encapsulation layer, and a second inorganic encapsulation layer formed on the organic encapsulation layer. Encapsulation layers 308 formed in this way can help prevent moisture and other potential contaminants from damaging the conductive circuitry that is covered by layers 308. Substrate 300, polyimide layers 302, buffer layers 303, TFT layers 304, OLED layers 306, and encapsulation layers 308 may be collectively referred to as a display panel.

One or more polarizer films 312 may be formed over the encapsulation layers 308 using adhesive 310. Adhesive 310 may be implemented using optically clear adhesive (OCA) material that offer high light transmittance. One or more touch layers 316 that implement the touch sensor functions of touch-screen display 14 may be formed over polarizer films 312 using adhesive 314 (e.g., OCA material). For example, touch layers 316 may include horizontal touch sensor electrodes and vertical touch sensor electrodes collectively forming an array of capacitive touch sensor electrodes. Lastly, the display stack may be topped off with a cover glass layer 320 (sometimes referred to as a display cover layer 320) that is formed over the touch layers 316 using additional adhesive 318 (e.g., OCA material). display cover layer 320 may be a transparent layer (e.g., transparent plastic or glass) that serves as an outer protective layer for display 14. The outer surface of display cover layer 320 may form an exterior surface of the display and the electronic device that includes the display.

Still referring to FIG. 3, sensor 13 may be formed under the display stack within the electronic device 10. As described above in connection with FIG. 1, sensor 13 may be an optical sensor such as a camera, proximity sensor, ambient light sensor, fingerprint sensor, or other light-based sensor. In some cases, sensor 13 may include a light-emitting component that emits light through the display. Sensor 13 may therefore sometimes be referred to as input-output component 13. Input-output component 13 may be a sensor or a light-emitting component (e.g., that is part of a sensor). The performance of input-output component 13 depends on the transmission of light traversing through the display stack, as indicated by arrow 350. A typical display stack, however, has fairly limited transmission properties. For instance, more than 80% of light in the visible and infrared light spectrum might be lost when traveling through the display stack, which makes sensing under display 14 challenging.

Each of the multitude of layers in the display stack contributes to the degraded light transmission to sensor 13. In particular, the dense thin-film transistors and associated routing structures in TFT layers 304 of the display stack contribute substantially to the low transmission. In accordance with an embodiment, at least some of the display pixels may be selectively removed in regions of the display stack located directly over sensor(s) 13. Regions of display 14 that at least partially cover or overlap with sensor(s) 13 in which at least a portion of the display pixels have been removed are sometimes referred to as pixel removal regions, low density pixel regions, or high transmittance regions. Removing and/or shrinking display pixels (e.g., removing transistors and/or capacitors associated with one or more sub-pixels) in the pixel removal regions can drastically help increase transmission and improve the performance of the under-display sensor 13. In addition to removing display pixels, portions of additional layers such as polyimide layers 302 and/or substrate 300 may be removed for additional transmission improvement. Polarizer 312 may also be bleached for additional transmission improvement.

Figure 4:
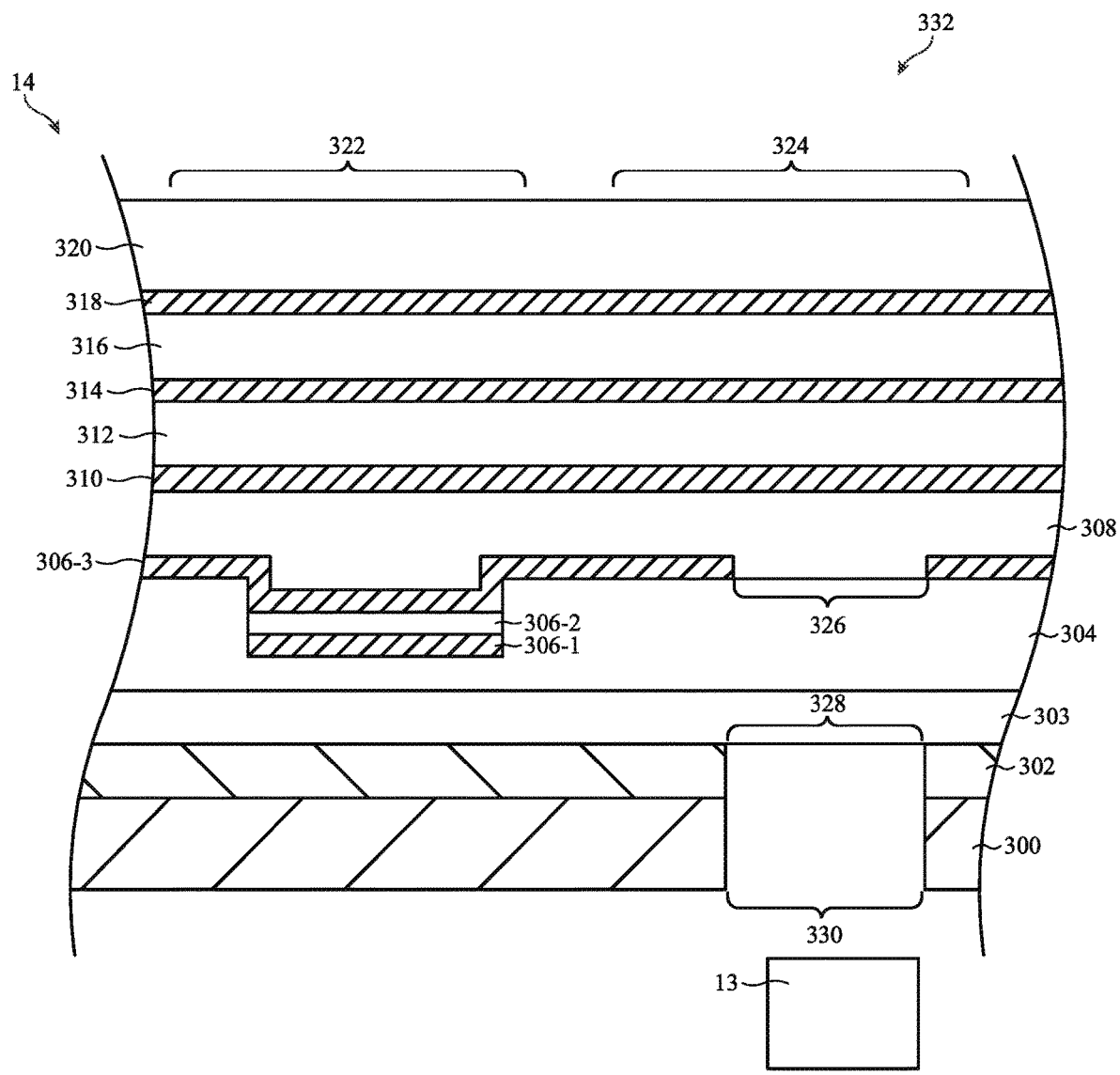
FIG. 4 is a cross-sectional side view of an illustrative display stack with a high-transmittance area that overlaps a sensor in accordance with various embodiments.

FIG. 4 is a cross-sectional side view of an illustrative display showing how pixels may be removed in a pixel removal region 332 to increase transmission through the display. As shown in FIG. 4, display 14 may include a pixel region 322 and a high-transmittance area 324. In the pixel region 322, the display may include a pixel formed from emissive material 306-2 that is interposed between an anode 306-1 and a cathode 306-3. Signals may be selectively applied to anode 306-1 to cause emissive material 306-2 to emit light for the pixel. Circuitry in thin-film transistor layer 304 may be used to control the signals applied to anode 306-1.

In high-transmittance area 324, anode 306-1 and emissive material 306-2 may be omitted. Without the high-transmittance area, an additional pixel may be formed in area 324 adjacent to the pixel in area 322. However, to increase the transmittance of light to sensor 13 under the display, the pixels in area 324 are removed. The absence of emissive material 306-2 and anode 306-1 may increase the transmittance through the display stack. Additional circuitry within thin-film transistor layer 304 may also be omitted in high-transmittance area 324 to increase transmittance.

Additional transmission improvements through the display stack may be obtained by selectively removing additional components from the display stack in high-transmittance area 324. As shown in FIG. 4, a portion of cathode 306-3 may be removed in high-transmittance area 324. This results in an opening 326 in the cathode 306-3. Said another way, the cathode 306-3 may have conductive material that defines an opening 326 in the pixel removal region. Removing the cathode in this way allows for more light to pass through the display stack to sensor 13. Cathode 306-3 may be formed from any desired conductive material. The cathode may be removed via etching (e.g., laser etching or plasma etching). Alternatively, the cathode may be patterned to have an opening in high-transmittance area 324 during the original cathode deposition and formation steps.

Polyimide layers 302 may be removed in high-transmittance area 324 in addition to cathode layer 306-3. The removal of the polyimide layers 302 results in an opening 328 in the pixel removal region. Said another way, the polyimide layer may have polyimide material that defines an opening 328 in the high-transmittance region. The polyimide layers may be removed via etching (e.g., laser etching or plasma etching). Alternatively, the polyimide layers may be patterned to have an opening in high-transmittance area 324 during the original polyimide formation steps. Removing the polyimide layer 302 in high-transmittance area 324 may result in additional transmittance of light to sensor 13 in high-transmittance area 324.

Substrate 300 may be removed in high-transmittance area 324 in addition to cathode layer 306-3 and polyimide layer 302. The removal of the substrate 300 results in an opening 330 in the high-transmittance area. Said another way, the substrate 300 may have material (e.g., PET, PEN, etc.) that defines an opening 330 in the pixel removal region. The substrate may be removed via etching (e.g., with a laser). Alternatively, the substrate may be patterned to have an opening in high-transmittance area 324 during the original substrate formation steps. Removing the substrate 300 in high-transmittance area 324 may result in additional transmittance of light in high-transmittance area 324. The polyimide opening 328 and substrate opening 330 may be considered to form a single unitary opening. When removing portions of polyimide layer 302 and/or substrate 300, inorganic buffer layers 303 may serve as an etch stop for the etching step. Openings 328 and 330 may be filled with air or another desired transparent filler.

In addition to having openings in cathode 306-3, polyimide layers 302, and/or substrate 300, the polarizer 312 in the display may be bleached for additional transmittance in the pixel removal region.

Figure 5:
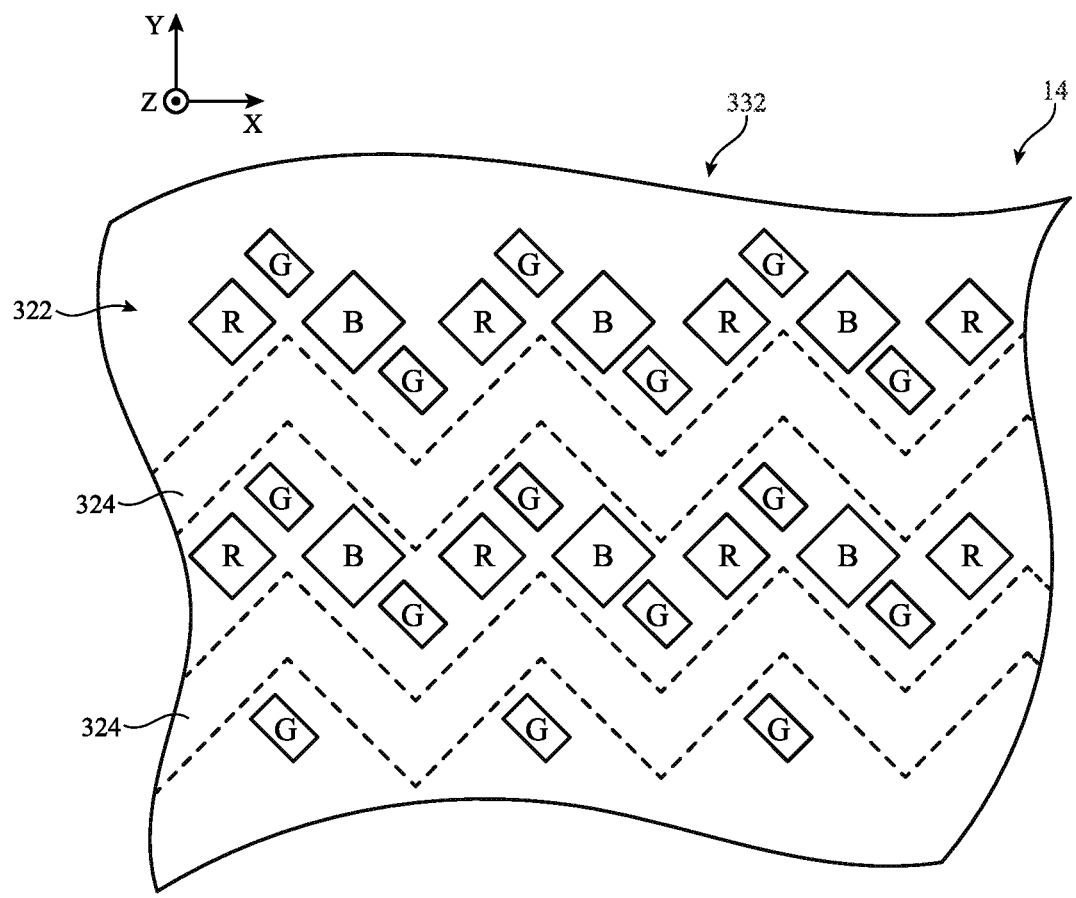
FIG. 5 is a top view of an illustrative display with transparent openings that overlap a sensor in accordance with various embodiments.

FIG. 5 is a top view of an illustrative display showing how high-transmittance areas may be incorporated into a pixel removal region 332 of the display. As shown, the display may include a plurality of pixels. In FIG. 5, there are a plurality of red pixels (R), a plurality of blue pixels (B), and a plurality of green pixels (G). The red, blue, and green pixels may be arranged in any desired pattern. Different nomenclature may be used to refer to the red, green, and blue pixels in the display. As one option, the red, blue, and green pixels may be referred to simply as pixels. As another option, the red, blue, and green pixels may instead be referred to as red, blue, and green sub-pixels (or emissive sub-pixels). In this example, a group of sub-pixels of different colors may be referred to as pixel. In high-transmittance areas 324, no sub-pixels are included in the display (even though sub-pixels would normally be present if the normal sub-pixel pattern was followed).

To provide a uniform distribution of sub-pixels across the display surface, an intelligent pixel removal process may be implemented that systematically eliminates the closest sub-pixel of the same color (e.g., the nearest neighbor of the same color may be removed). The pixel removal process may involve, for each color, selecting a given sub-pixel, identifying the closest or nearest neighboring sub-pixels of the same color (in terms of distance from the selected sub-pixel), and then eliminating/omitting those identified sub-pixels in the final pixel removal region. With this type of arrangement, there may be high-transmittance areas in the pixel removal region, allowing a sensor or light-emitting component to operate through the display in the pixel removal region. Additionally, because some of the pixels remain present in the pixel removal region (e.g., 50% of the pixels in the layout of FIG. 5), the pixel removal region may not have a perceptibly different appearance from the rest of the display for a viewer.

As shown in FIG. 5, display 14 may include high-transmittance areas 324. Each high-transmittance area 324 may have pixels removed in that area. Each high-transmittance area also has an increased transparency compared to pixel region 322. The high-transmittance areas 324 may sometimes be referred to as transparent windows 324, transparent display windows 324, transparent openings 324, transparent display openings 324, etc. The transparent display windows may allow for light to be transmitted through the display to an underlying sensor or for light to be transmitted through the display from a light source underneath the display. The transparency of transparent openings 324 (for visible and/or infrared light) may be greater than 25%, greater than 30%, greater than 40%, greater than 50%, greater than 60%, greater than 70%, greater than 80%, greater than 90%, etc. The transparency of transparent openings 324 may be greater than the transparency of pixel region 322. The transparency of pixel region 322 may be less than 25%, less than 20%, less than 10%, less than 5%, etc. The pixel region 322 may sometimes be referred to as opaque display region 322, opaque region 322, opaque footprint 322, etc. Opaque region 322 includes light emitting pixels R, G, and B, and blocks light from passing through the display.

The pattern of pixels (322) and high-transmittance areas (324) in FIG. 5 is merely illustrative. The pattern of sub-pixels and pixel removal regions in FIG. 5 is also merely illustrative. In FIG. 5, the display edge may be parallel to the X axis or the Y axis. The front face of the display may be parallel to the XY plane such that a user of the device views the front face of the display in the Z direction. In FIG. 5, every other sub-pixel may be removed for each color. The resulting pixel configuration has 50% of the sub-pixels removed. In FIG. 5, the remaining pixels follow a zigzag pattern across the display (with two green sub-pixels for every one red or blue sub-pixel). In FIG. 5, the sub-pixels have edges angled relative to the edges of the display (e.g., the edges of the sub-pixels are at non-zero, non-orthogonal angles relative to the X-axis and Y-axis). This example is merely illustrative. If desired, each individual sub-pixel may have edges parallel to the display edge, a different proportion of pixels may be removed for different colors, the remaining pixels may follow a different pattern, etc.

Figure 6A:
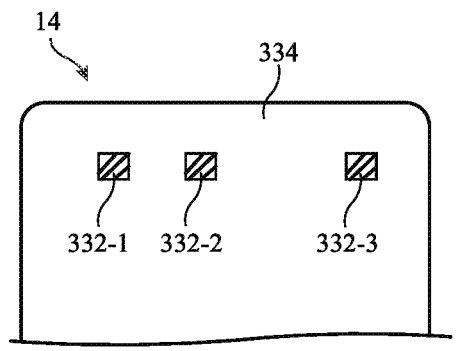
FIGS. 6A-6F are top views of illustrative displays showing possible positions for pixel removal regions in accordance with various embodiments.

In general, the display sub-pixels may be partially removed from any region(s) of display 14. FIGS. 6A-6F are front views showing how display 14 may have one or more localized pixel removal regions in which the sub-pixels are selectively removed. The example of FIG. 6A illustrates various local pixel removal regions 332 (sometimes referred to as low pixel density regions or high-transmittance region 332) physically separated from one another (i.e., the various pixel removal regions 332 are non-continuous) by full pixel density region 334. The full pixel density region 334 (sometimes referred to as full pixel density area 334) does not include any transparent windows 324 (e.g., none of the sub-pixels are removed and the display follows the pixel pattern without modifications). The full pixel density region 334 has a higher pixel density (pixels per unit area) than low pixel density regions 332. The three pixel removal regions 332-1, 332-2, and 332-3 in FIG. 6A might for example correspond to three different sensors formed underneath display 14 (with one sensor per pixel removal region).

Figure 6B:
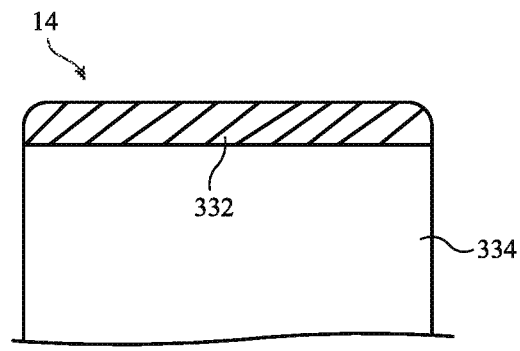
Figure 6C:
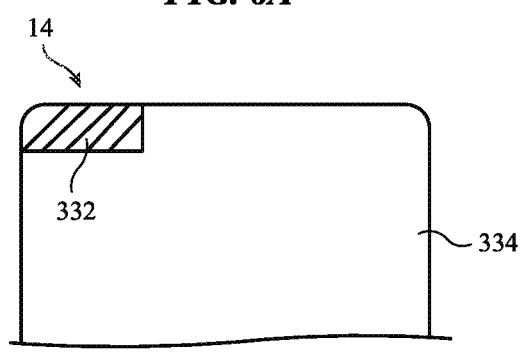
Figure 6D:
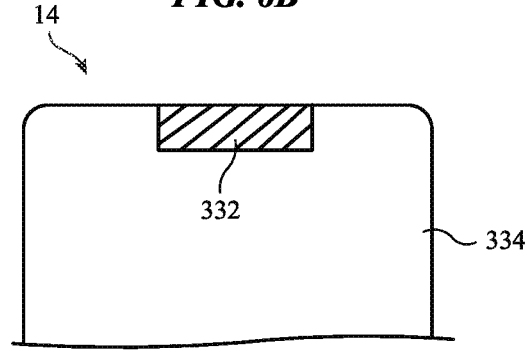
Figure 6E:
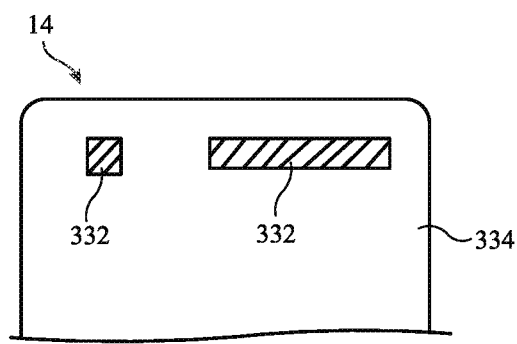
Figure 6F:
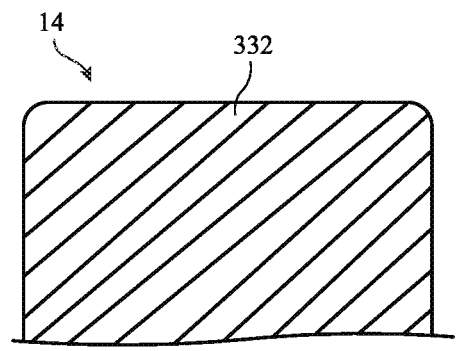

The example of FIG. 6B illustrates a continuous pixel removal region 332 formed along the top border of display 14, which might be suitable when there are many optical sensors positioned near the top edge of device 10. The example of FIG. 6C illustrates a pixel removal region 332 formed at a corner of display 14 (e.g., a rounded corner area of the display). In some arrangements, the corner of display 14 in which pixel removal region 332 is located may be a rounded corner (as in FIG. 6C) or a corner having a substantially 90° corner. The example of FIG. 6D illustrates a pixel removal region 332 formed only in the center portion along the top edge of device 10 (i.e., the pixel removal region covers a recessed notch area in the display). FIG. 6E illustrates another example in which pixel removal regions 332 can have different shapes and sizes. FIG. 6F illustrates yet another suitable example in which the pixel removal region covers the entire display surface. These examples are merely illustrative and are not intended to limit the scope of the present embodiments. If desired, any one or more portions of the display overlapping with optically based sensors or other sub-display electrical components may be designated as a pixel removal region/area.

FIG. 5 shows an example of a pixel removal region where some sub-pixels are removed in favor of transparent openings in the display. FIG. 5 shows a layout for sub-pixels within the pixel removal region. It should be noted that these layouts are for the emissive layer of each sub-pixel.

Each display pixel 22 may include both a thin-film transistor layer and an emissive layer. Each emissive layer portion may have associated circuitry on the thin-film transistor layer that controls the magnitude of light emitted from that emissive layer portion. Both the emissive layer and thin-film transistor layer may have corresponding sub-pixels within the pixel. Each sub-pixel may be associated with a different color of light (e.g., red, green, and blue). The emissive layer portion for a given sub-pixel does not necessarily need to have the same footprint as its associated thin-film transistor layer portion. Hereinafter, the term sub-pixel may sometimes be used to refer to the combination of an emissive layer portion and a thin-film transistor layer portion. Additionally, the thin-film transistor layer may be referred to as having thin-film transistor sub-pixels (e.g., a portion of the thin-film transistor layer that controls a respective emissive area, sometimes referred to as thin-film transistor layer pixels, thin-film transistor layer sub-pixels or simply sub-pixels) and the emissive layer may be referred to as having emissive layer sub-pixels (sometimes referred to as emissive pixels, emissive sub-pixels or simply sub-pixels).

The thin-film transistor sub-pixels used to control the emissive sub-pixels in high transmittance region 332 may be consolidated in a transition area of the display that does not overlap sensor 13. This increases the transparency of the display over sensor 13. Signal lines may be used to electrically connect thin-film transistor sub-pixels to their respective emissive sub-pixels that overlap sensor 13.

Figure 7:
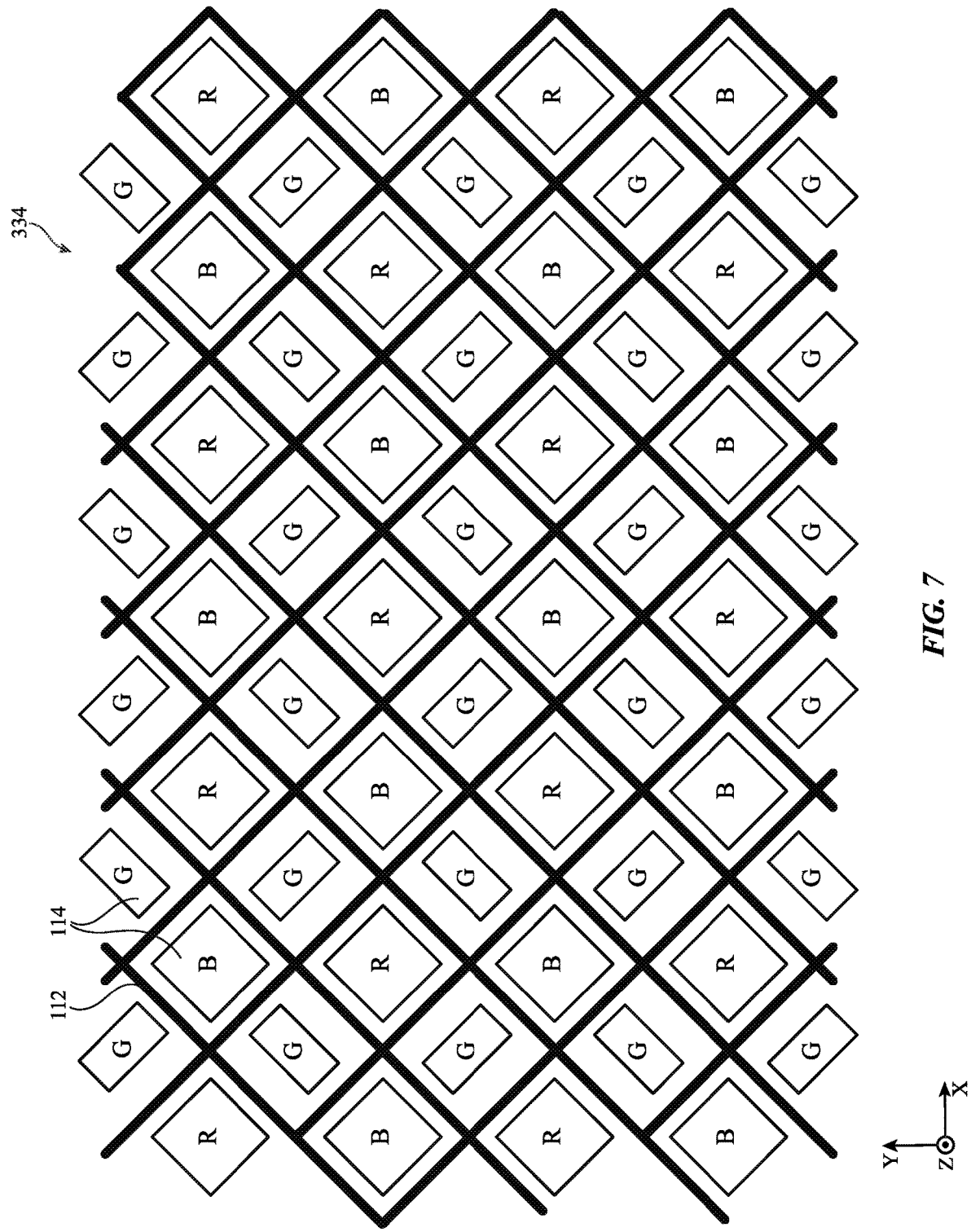
FIG. 7 is a top view of an illustrative full pixel density region of a display that includes touch sensor metal in accordance with various embodiments.

FIG. 7 is a top view of display 14 showing touch sensor metal in full pixel density region 334. As shown in FIG. 7, a touch sensor electrode 112 is formed over emissive sub-pixels (sometimes referred to simply as pixels) in full pixel density region 334. As discussed in connection with FIG. 3, one or more touch layers 316 that implement the touch sensor functions of touch-screen display 14 may be formed over polarizer films 312 using adhesive 314 (e.g., OCA material). The touch layers therefore are formed over the emissive material (e.g., emissive material 306-2 in FIG. 4) of the pixels. Touch layers 316 may include electrodes (e.g., horizontal touch sensor electrodes and/or vertical touch sensor electrodes) such as electrode 112 in FIG. 7. Electrode 112 may be part of an array of capacitive touch sensor electrodes.

The touch sensor electrode may be formed from a conductive material such as metal. The touch sensor electrode may be opaque (e.g., with a transmission of less than 60%, less than 50%, less than 40%, less than 30%, less than 20%, less than 10%, less than 5%, less than 3%, less than 1%, etc.). Accordingly, the touch sensor metal is positioned to not overlap the pixels in the light emitting direction (e.g., in the Z-direction in FIG. 7). As shown in FIG. 7, in the full pixel density region 334, touch sensor electrode 112 (sometimes referred to as touch sensor metal 112) may be formed as a mesh that defines a plurality of openings. Each opening overlaps a respective emissive sub-pixel 114 in the Z-direction and is aligned with that respective emissive sub-pixel 114 within the XY-plane. Each emissive sub-pixel is aligned with an opening in the touch sensor electrode such that the emissive sub-pixel is not directly vertically overlapped by the touch sensor electrode.

Figure 8:
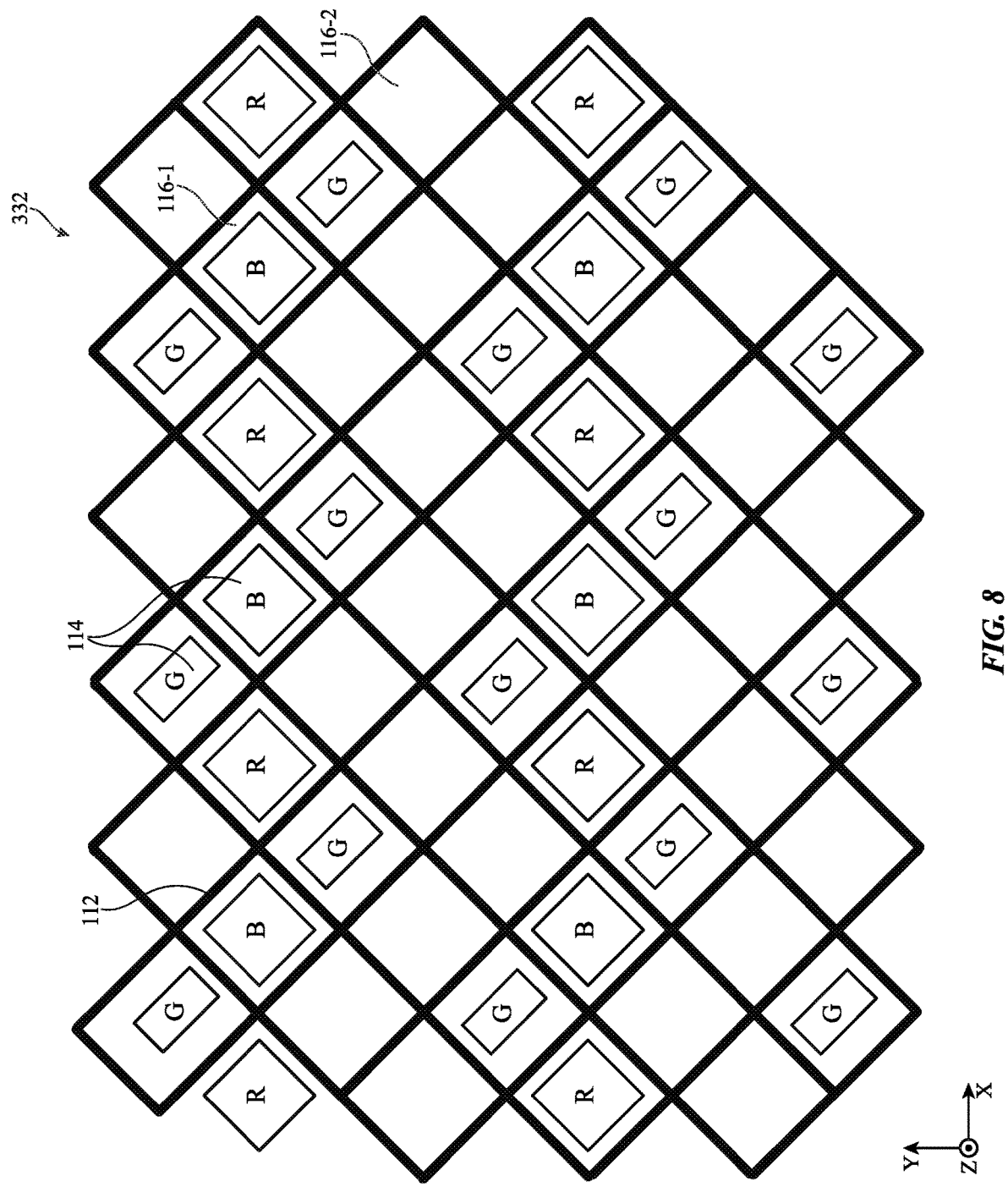
FIG. 8 is a top view of an illustrative pixel removal region of a display that includes touch sensor metal in accordance with various embodiments.

FIG. 8 is a top view of display 14 showing touch sensor metal in pixel removal region 332. In this example, the touch sensor electrode 112 has the same arrangement as in full pixel density region 334. Therefore, the touch sensor electrode 112 in pixel removal region 332 is formed as a mesh that defines a plurality of openings. Some of the openings overlap (in the Z-direction) and are aligned with the emissive sub-pixels 114 that remain present in pixel removal region 332. Some of the openings overlap the position of emissive sub-pixels that are removed in pixel removal region 332. For example, touch sensor electrode 112 in FIG. 8 defines an opening 116-1 that overlaps a blue emissive sub-pixel that is present in pixel removal region 332. Touch sensor electrode 112 in FIG. 8 also defines an opening 116-2 that does not overlap any emissive sub-pixels. If no sub-pixels were removed in pixel removal region 332, opening 116-2 would overlap and be aligned with a blue emissive sub-pixel. Even though the corresponding blue emissive sub-pixel is removed in region 332, the opening is still present.

Including a touch sensor electrode in pixel removal region 332 with the same arrangement as in full pixel density region 334 may maximize the touch sensing performance in region 332 of display 14. However, the presence of touch sensor metal in pixel removal region 332 undesirably blocks light from passing through the display, reducing the overall transmittance of pixel removal region 332. Removing some of the touch sensor metal improves the transmission through the display (which is better for performance of a camera or other sensor that operates through the display) but reduces touch sensor performance. Including more touch sensor metal improves touch sensor performance but reduces transmission through the display (which is worse for performance of a camera or other sensor that operates through the display).

To optimize both touch sensing performance and transmission through the display, the arrangement of the touch sensor metal in pixel removal region 332 may be modified relative to the arrangement of the touch sensor metal in full pixel density region 334. To improve transmission while maintaining satisfactory touch sensing performance, one or more segments of the touch sensor metal in region 332 may have a reduced width relative to the touch sensor metal in region 334 (as in FIG. 9) and/or one or more segments of the touch sensor metal in region 332 may be omitted relative to the touch sensor metal in region 334 (as in FIGS. 10-13). In general, the total coverage per unit area of the touch sensor metal (i.e., the total surface area of the touch sensor metal divided by the total surface area of the unit area) in region 332 may be lower than in region 334 to increase transmittance in region 332.

Figure 9:
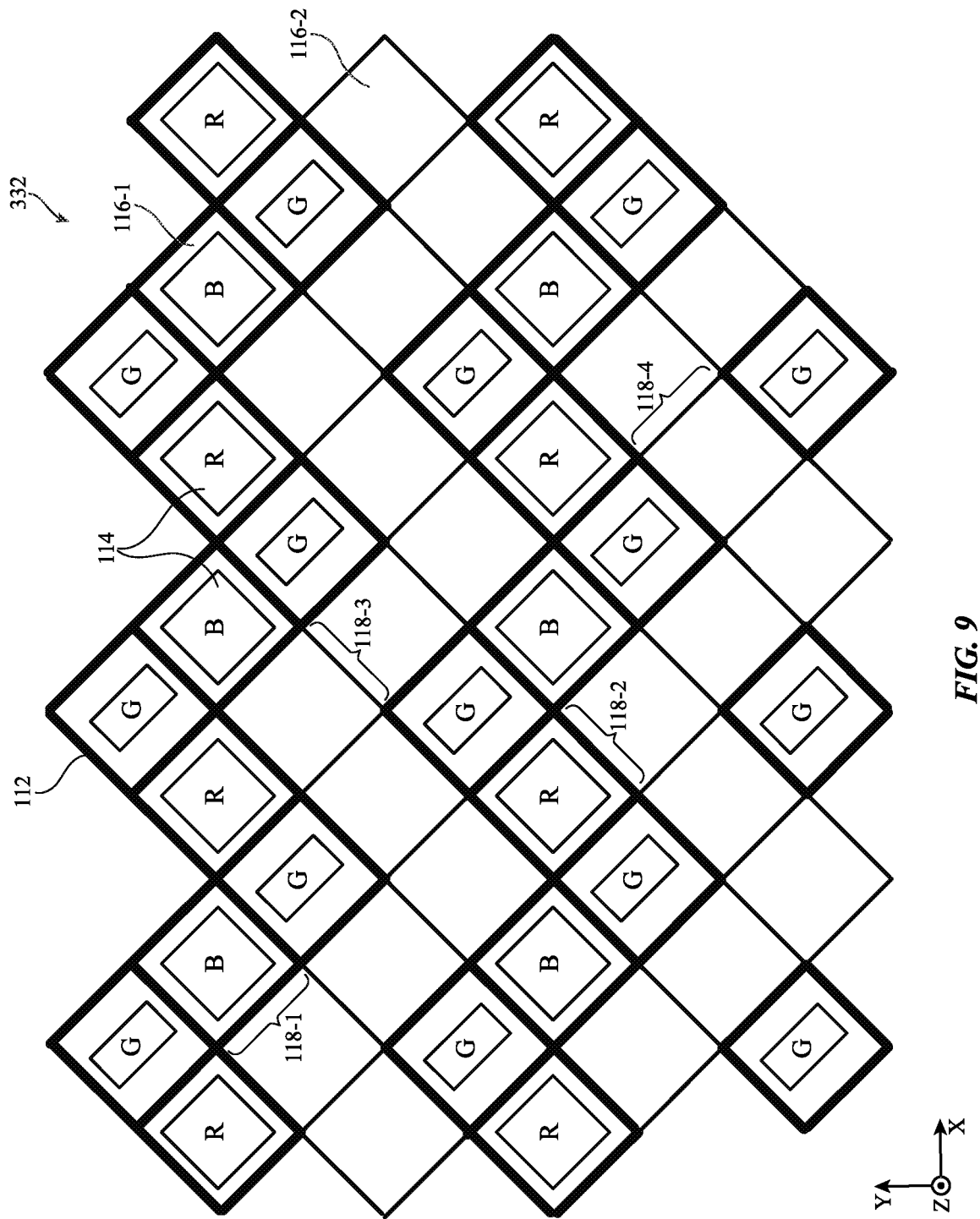
FIG. 9 is a top view of an illustrative pixel removal region of a display that includes touch sensor metal with narrowed segments in accordance with various embodiments.

FIG. 9 is a top view of display 14 showing touch sensor metal in pixel removal region 332. In this example, the touch sensor metal 112 has one or more segments with a reduced width relative to the touch sensor metal in region 334. In FIG. 9, as in FIG. 8, the touch sensor electrode 112 is formed as a mesh that defines a plurality of openings. Some of the openings overlap (in the Z-direction) and are aligned with the emissive sub-pixels 114 that remain present in pixel removal region 332. Some of the openings overlap the position of emissive sub-pixels that are removed in pixel removal region 332. For example, touch sensor electrode 112 in FIG. 9 defines an opening 116-1 that overlaps a blue emissive sub-pixel that is present in pixel removal region 332. Touch sensor electrode 112 in FIG. 9 also defines an opening 116-2 that does not overlap any emissive sub-pixels.

Some of the segments of touch sensor electrode 112 in FIG. 9 (e.g., segments 118-1 and 118-2) have a first width. Some of the segments of touch sensor electrode 112 in FIG. 9 (e.g., segments 118-3 and 118-4) have a second width. The first width is larger than the second width. In the full pixel density region 334, all of the touch sensor metal segments may have the first width. In the pixel removal region 332, only some of the touch sensor metal segments may have the first width. As one example, shown in FIG. 9, touch sensor metal segments that are directly adjacent to an edge of an emissive sub-pixel may have the first width. Touch sensor metal segments that are not directly adjacent to an edge of an emissive sub-pixel (e.g., segments 118-3 and 118-4) have the second width.

The difference between the first and second widths may be greater than 0.1 microns, greater than 0.5 microns, greater than 1 micron, greater than 2 microns, greater than 5 microns, between 0.1 micron and 2 microns, less than 2 microns, etc. The magnitude of the first width may be greater than 2 microns, greater than 3 microns, greater than 5 microns, less than 10 microns, less than 5 microns, less than 3 microns, between 2 microns and 4 microns, etc. The magnitude of the second width may be greater than 1 micron, greater than 2 microns, greater than 3 microns, less than 5 microns, less than 3 microns, less than 2 microns, between 1 micron and 3 microns, etc.

Narrowing some but not all of the touch sensor metal segments in pixel removal region 332 relative to full pixel density region 334 may increase the overall transmittance of pixel removal region 332. For example, the transmittance in pixel removal region 332 in FIG. 9 may be at least 1% greater than the transmittance in pixel removal region in FIG. 8, at least 2% greater than the transmittance in pixel removal region in FIG. 8, etc.

In another possible arrangement, all of the touch sensor metal segments in region 332 may have the second width (that is smaller than the first width used in region 334).

In FIG. 9, the total coverage of touch sensor metal per unit area in pixel removal region 332 is lower (e.g., greater than 10% lower, greater than 20% lower, greater than 30% lower, greater than 50% lower, greater than 75% lower, etc.) than the total coverage of touch sensor metal per unit area in full pixel density region 334 (in FIG. 7).

Figure 10:
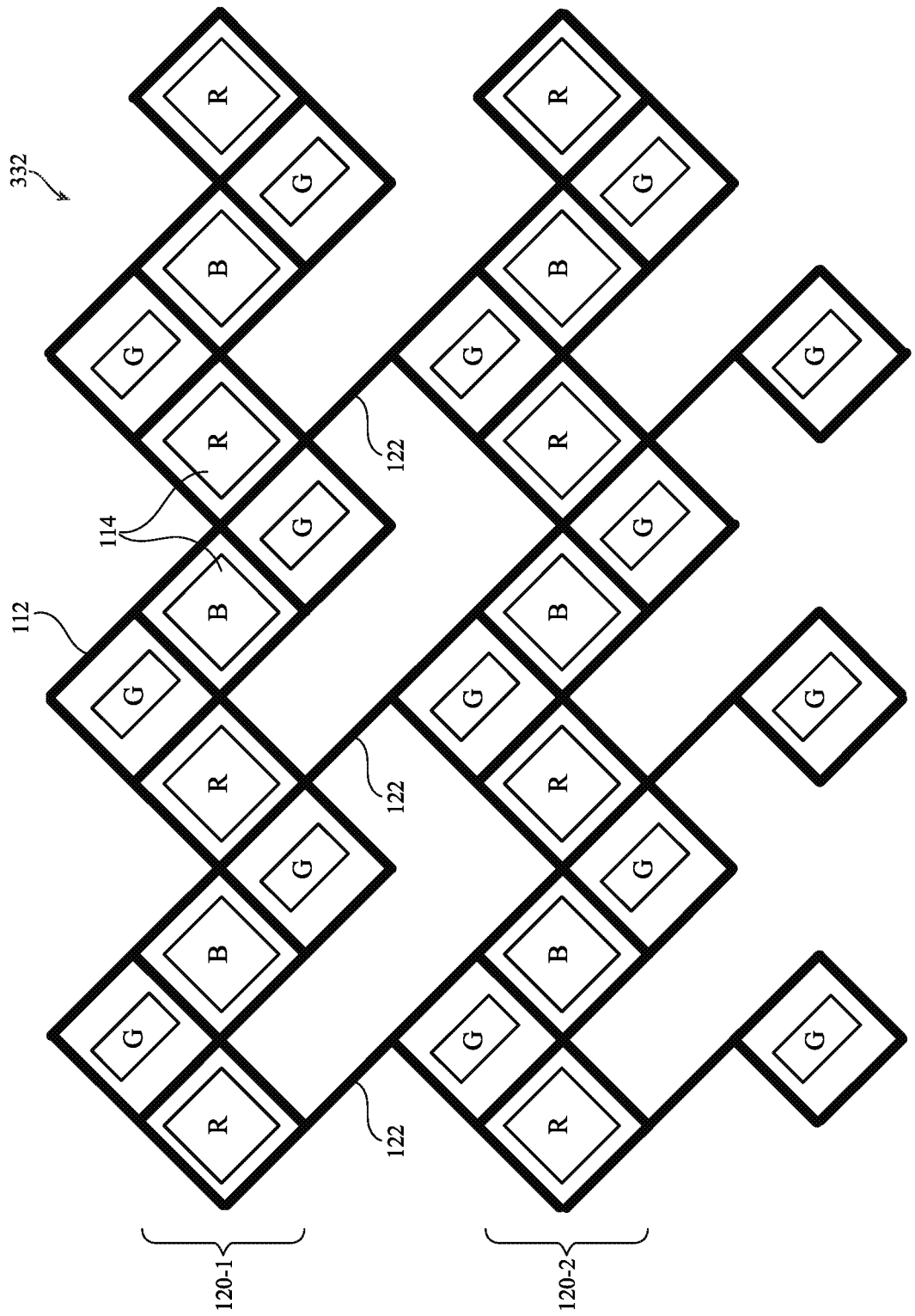
FIGS. 10-13 are top views of illustrative pixel removal regions that include touch sensor metal with omitted segments in accordance with various embodiments.

FIG. 10 is a top view of display 14 showing another arrangement for touch sensor metal in pixel removal region 332. In this example, the touch sensor electrode 112 has one or more segments omitted relative to the touch sensor metal in region 334. In FIG. 10, each emissive sub-pixel 114 is laterally surrounded by 4 touch sensor metal segments. In other words, each emissive sub-pixel is positioned within a respective opening in a mesh formed by touch sensor electrode 112.

However, unlike in FIG. 8, touch sensor electrode 112 does not define openings around the locations of omitted emissive sub-pixels. In general, the touch sensor metal segments that would normally be present around the omitted emissive sub-pixels are omitted. Touch sensor electrode 112 may be considered to have respective portions 120 that overlap the emissive sub-pixels that are included in pixel removal region 332. For example, portion 120-1 forms a mesh that defines openings for each emissive sub-pixel in a single first zigzag row of emissive sub-pixels and portion 120-2 forms a mesh that defines openings for each emissive sub-pixel in a single second zigzag row of emissive sub-pixels.

In FIG. 10, intermittent touch sensor metal segments 122 are included to electrically connect portions 120 of the touch sensor metal. Including touch sensor metal segments 122 ensures that portions 120 are electrically connected, reducing sheet resistance across electrode 112 and improving current distribution across electrode 112. In FIG. 10, one connecting segment 122 is included for every four lateral emissive sub-pixels in a given zigzag row. This example is merely illustrative. In general, any desired number of connecting segments 122 may be included in the touch sensor electrode. Similarly, in FIG. 10 a first row of connecting segments is aligned (along the X-direction) with a second row of connecting segments. This example is merely illustrative. If desired, a first row of connecting segments may be offset (along the X-direction) relative to a second row of connecting segments.

The touch sensor electrode of FIG. 7 defines a mesh with a first number of openings per unit area. The touch sensor electrode of FIG. 10 defines a mesh with a second number of openings per unit area that is lower than the first number of openings per unit area. The total coverage of touch sensor metal per unit area in pixel removal region 332 in FIG. 10 is lower (e.g., greater than 10% lower, greater than 20% lower, greater than 30% lower, greater than 50% lower, greater than 75% lower, etc.) than the total coverage of touch sensor metal per unit area in full pixel density region (in FIG. 7). This relationship of a lower total coverage per unit area in the pixel removal region holds true for the touch sensor metal in FIGS. 9-14 (relative to the full pixel density region touch sensor metal of FIG. 7).

Figure 11:
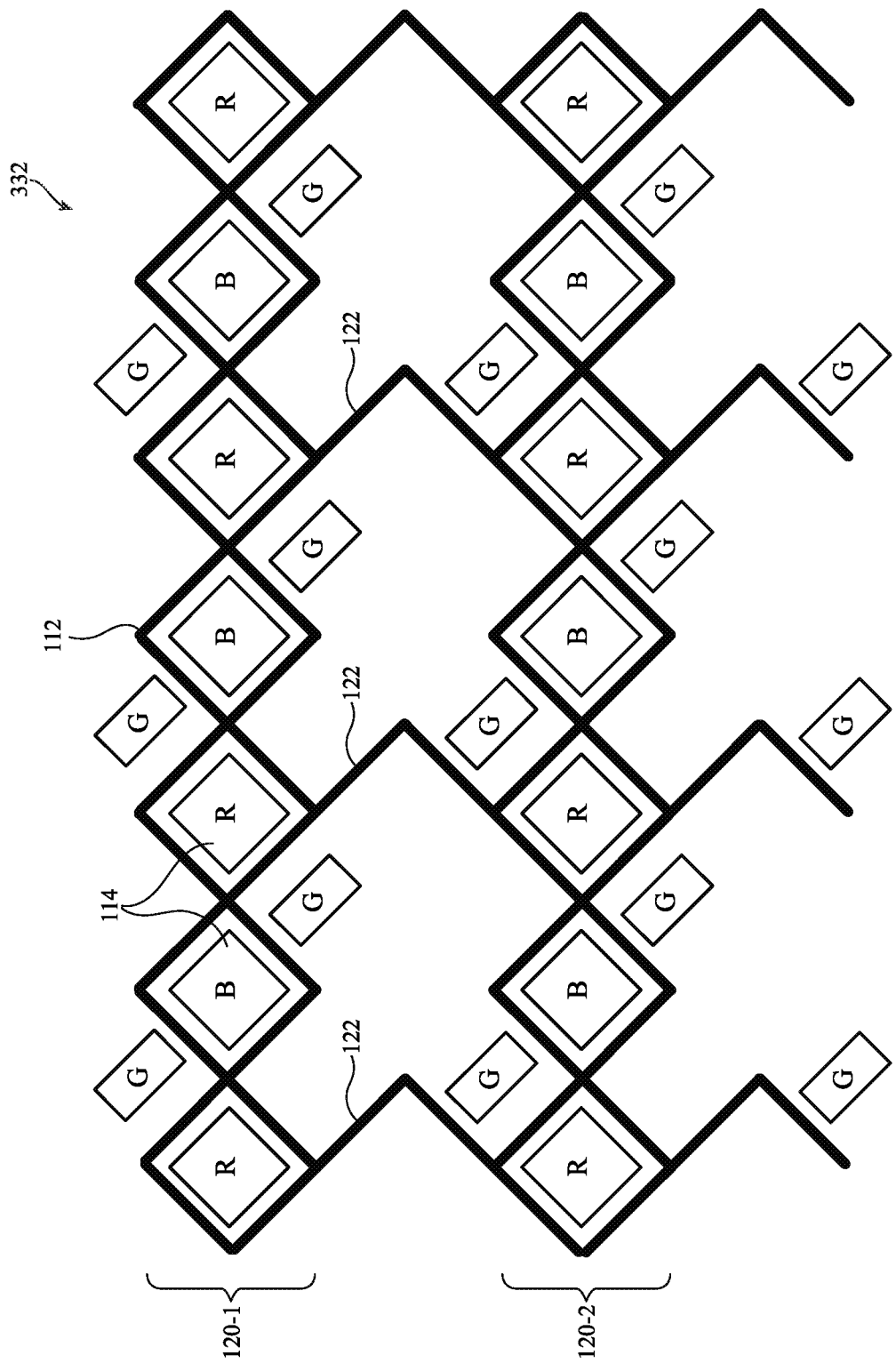

The arrangement in FIG. 10 is merely illustrative. If desired, additional, fewer, or different touch sensor metal segments may be omitted. FIG. 11 is a top view of a touch sensor electrode 112 with additional segments omitted relative to FIG. 10. In FIG. 11, touch sensor electrode 112 has portions 120 that define openings for some but not all of the emissive sub-pixels that are included in pixel removal region 332. For example, portion 120-1 forms a mesh that defines openings for each red and blue emissive sub-pixel in a first zigzag row of emissive sub-pixels and portion 120-2 forms a mesh that defines openings for each red and blue emissive sub-pixel in a second zigzag row of emissive sub-pixels. Portions 120-1 and 120-2 do not define openings for the green emissive sub-pixels in FIG. 11.

In FIG. 11, intermittent touch sensor metal segments 122 are included to electrically connect portions 120 of the touch sensor metal. Including touch sensor metal segments 122 ensures that portions 120 are electrically connected, reducing sheet resistance across electrode 112 and improving current distribution across electrode 112. In FIG. 11, one connecting segment 122 is included for every four lateral emissive sub-pixels in a given zigzag row. This example is merely illustrative. In general, any desired number of connecting segments 122 may be included in the touch sensor electrode. Similarly, in FIG. 11 a first row of connecting segments is aligned (along the X-direction) with a second row of connecting segments. This example is merely illustrative. If desired, a first row of connecting segments may be offset (along the X-direction) relative to a second row of connecting segments.

Figure 12:
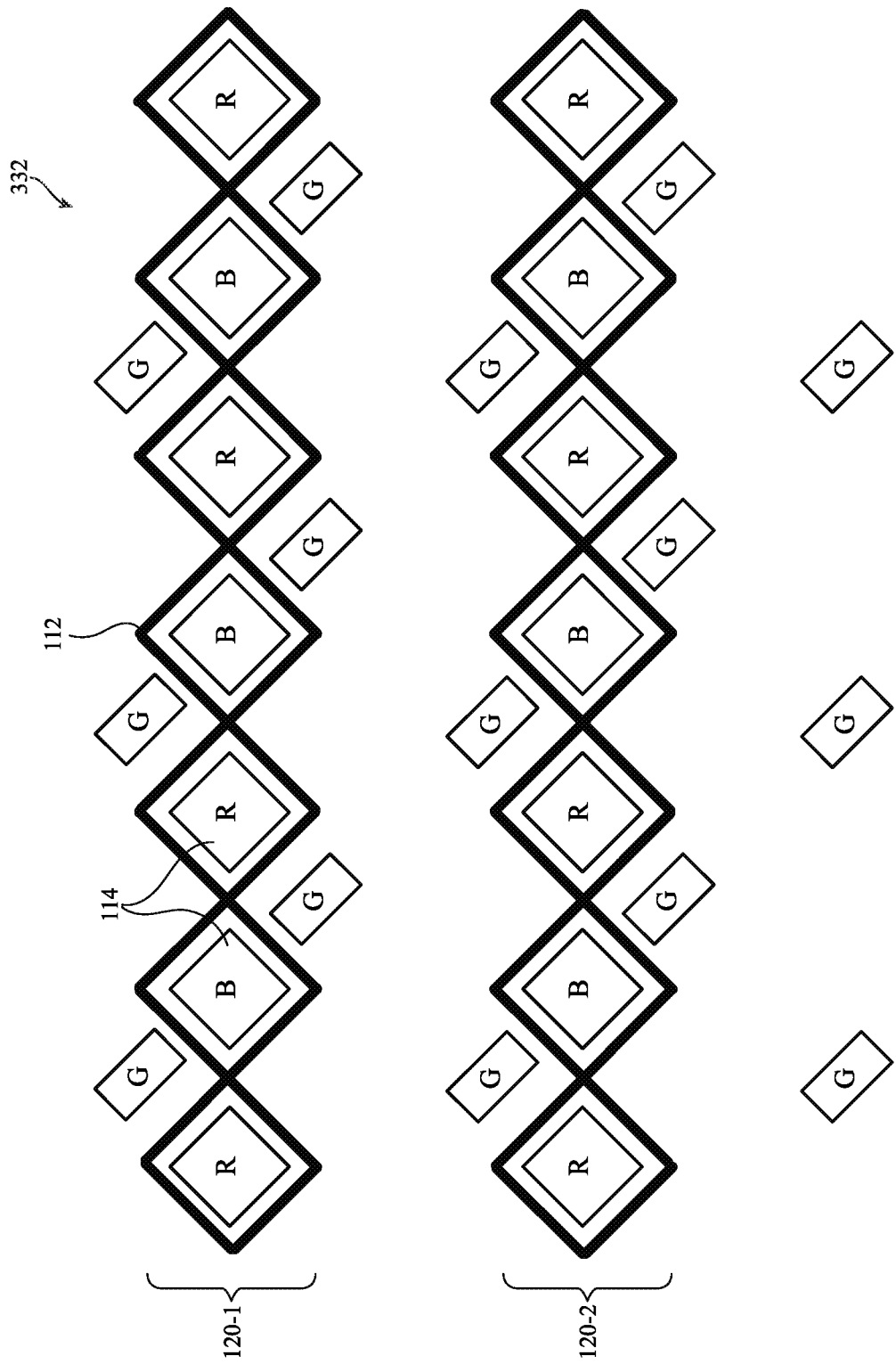

FIG. 12 is a top view of a touch sensor electrode 112 with additional segments omitted relative to FIG. 11. In FIG. 12, touch sensor electrode 112 has portions 120 that define openings that overlap some but not all of the emissive sub-pixels that are included in pixel removal region 332. For example, portion 120-1 forms a mesh that defines openings for each red and blue emissive sub-pixel in a first zigzag row of emissive sub-pixels and portion 120-2 forms a mesh that defines openings for each red and blue emissive sub-pixel in a second zigzag row of emissive sub-pixels. Portions 120-1 and 120-2 do not define openings for the green emissive sub-pixels in FIG. 12. The connecting segments 122 from FIGS. 10 and 11 are omitted in FIG. 12 to further improve the transmittance of pixel removal region 332.

Figure 13:
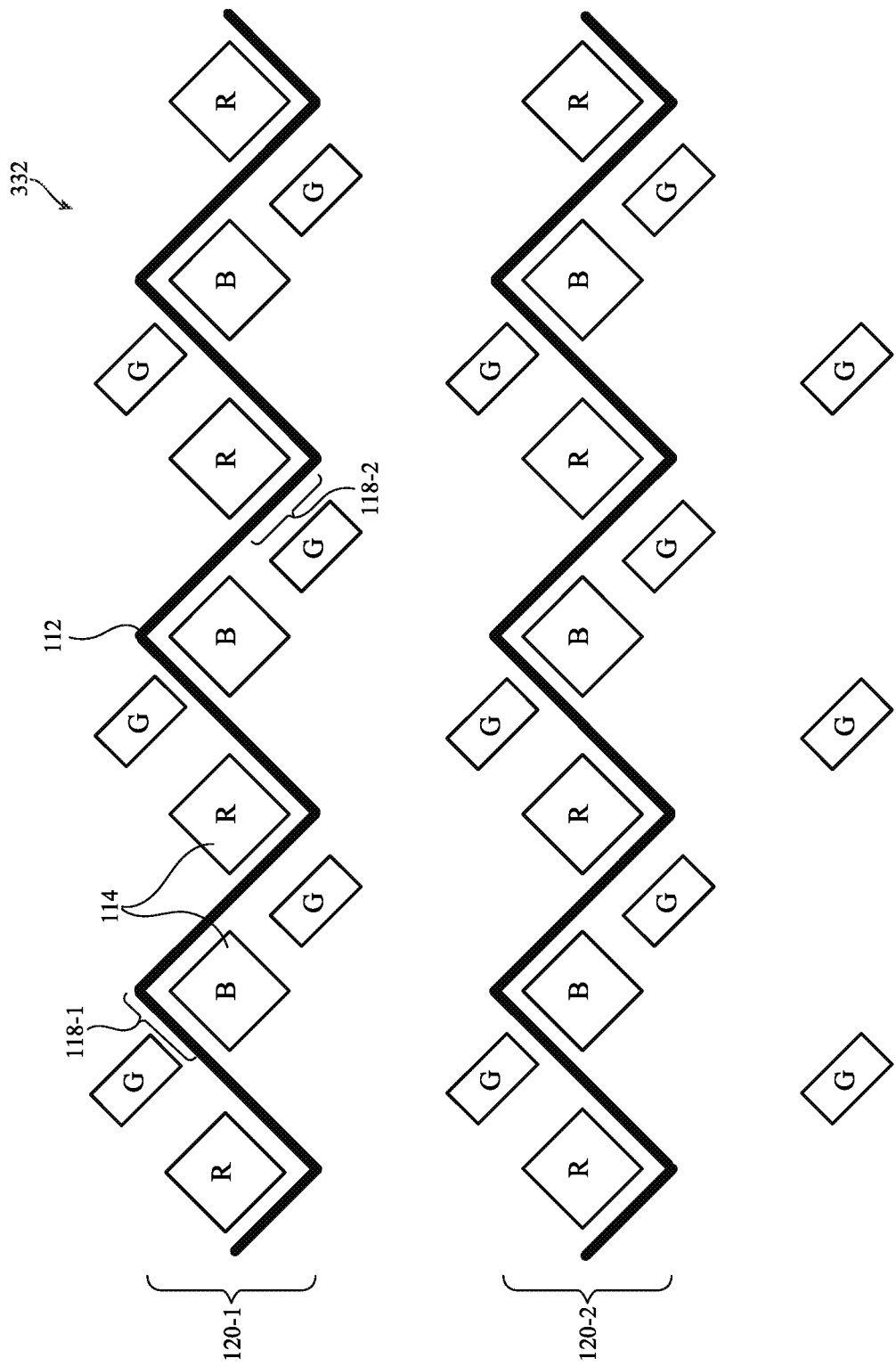

FIG. 13 is a top view of a touch sensor electrode 112 with additional segments omitted relative to FIG. 12. In FIG. 13, touch sensor electrode 112 has zigzag portions 120 that overlap the space between emissive sub-pixels 114 in pixel removal region 332. For example, portion 120-1 forms a zigzag line with some segments (e.g., segment 118-1) that are interposed between green and blue emissive sub-pixels and some segments (e.g., segments 118-2) that are interposed between green and red emissive sub-pixels. The connecting segments 122 from FIGS. 10 and 11 are omitted in FIG. 13 to further improve the transmittance of pixel removal region 332.

When connecting segments are not included in the touch sensor electrode (as in FIGS. 12 and 13), the touch sensor electrode may have one more conductive structures at its periphery to electrically connect portions 120. Alternatively, portions 120 may not be electrically connected and may each serve as individual touch sensor electrodes.

Connecting segments 122 (as in FIGS. 10 and 11) may optionally be included between portions 120 in the touch sensor metal of FIGS. 12 and 13 if desired.

It should further be noted that any of the touch sensor electrodes in FIGS. 10-13 (with omitted portions relative to the full pixel density region 334) may include one or more narrow segments (as in FIG. 9) to further improve transmittance. In other words, any of the arrangements of FIGS. 10-13 may be combined with the narrow segments of FIG. 9 if desired.

In FIGS. 10-13, the total coverage of touch sensor metal per unit area in pixel removal region 332 is lower (e.g., greater than 10% lower, greater than 20% lower, greater than 30% lower, greater than 50% lower, greater than 75% lower, etc.) than the total coverage of touch sensor metal per unit area in full pixel density region 334 (in FIG. 7).

Figure 14:
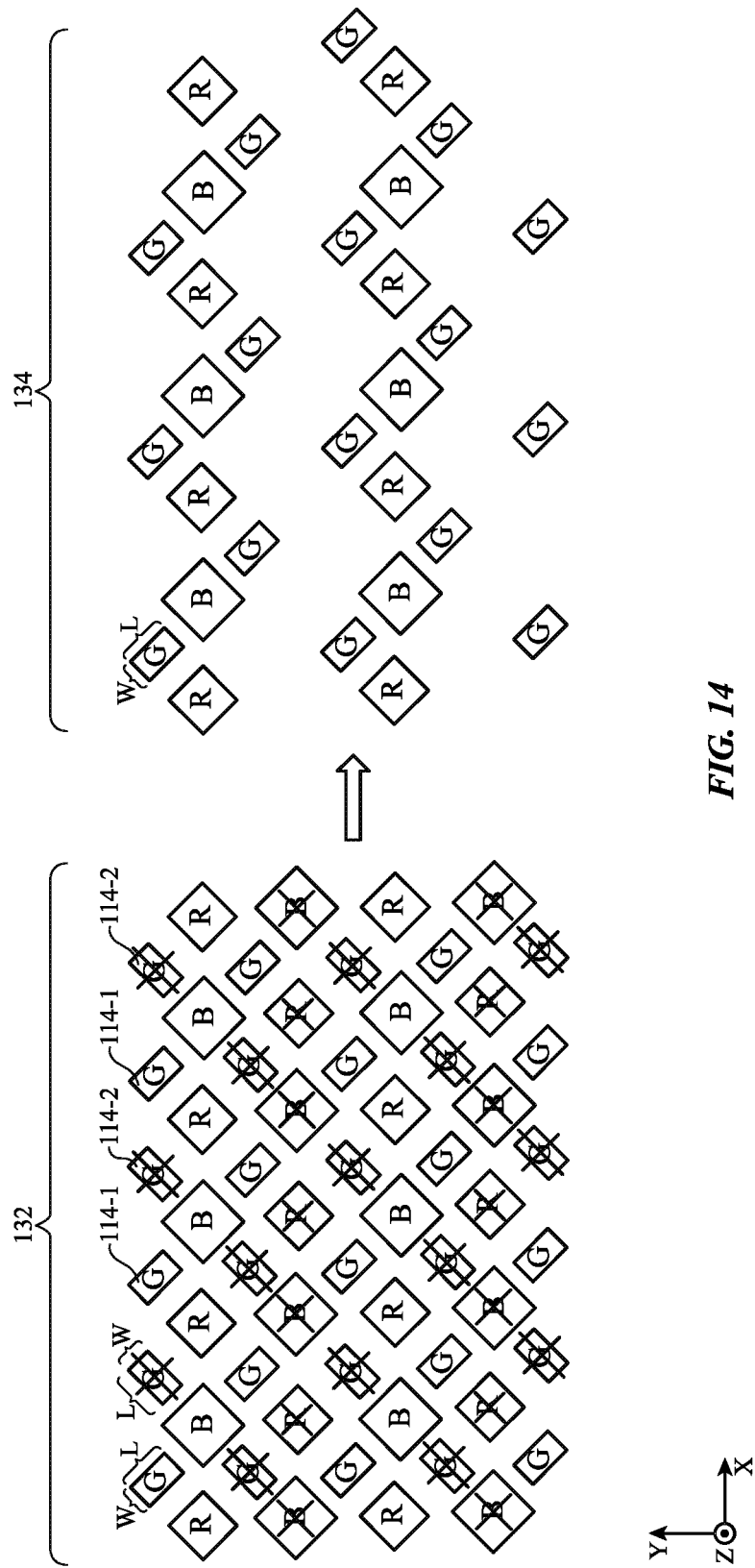
FIG. 14 is a diagram showing how a pixel removal process may result in green emissive sub-pixels of a single orientation being present in a layout for a pixel removal region in accordance with various embodiments.

FIG. 14 is a top view showing how pixels may be removed to form the pattern used in pixel removal region 332. Layout 132 shows the arrangement of red (R), blue (B), and green (G) pixels in a full pixel density region 334. To obtain the layout for the pixel removal region 332, certain pixels (marked with X's) are removed. To provide a uniform distribution of pixels across the display surface, an intelligent pixel removal process may be implemented that systematically eliminates the closest pixel of the same color (e.g., the nearest neighbor of the same color may be removed). The pixel removal process may involve, for each color, selecting a given pixel, identifying the closest or nearest neighboring pixels of the same color (in terms of distance from the selected pixel), and then eliminating/omitting those identified pixels in the final pixel removal region.

The pixel removal process produces layout 134 (with zigzag rows of pixels). As previously shown and discussed, the pixels in the pixel removal region 332 may use layout 134 (shown in FIG. 14).

As shown by layout 132, each green emissive sub-pixel has a non-square rectangular shape with a width (W) and length (L) in the full pixel density region 334 (e.g., before pixels are removed). Although the magnitude of the width and the magnitude of the length of the green emissive sub-pixels are the same across the layout, there are green emissive sub-pixels with two different orientations. Some of the green emissive sub-pixels (e.g., pixels 114-1) have lengths that extend from the upper left to the lower right. In other words, these lengths extend in the negative Y-direction when extending in the positive X-direction. Some of the green emissive sub-pixels (e.g., pixels 114-2) have lengths that extend from the lower left to the upper right. In other words, these lengths extend in the positive Y-direction when extending in the positive X-direction. Half of the pixels (e.g., pixels 114-1) may have the first orientation and the other half of the pixels (e.g., pixels 114-2) may have the second orientation.

As shown in FIG. 14, during the pixel removal process, all of the green emissive sub-pixels 114-2 are removed while all of the green emissive sub-pixels 114-1 remain. Accordingly, all of the green emissive sub-pixels in layout 134 (which is used in pixel removal region 332) have the first orientation (with lengths that extend from the upper left to the lower right). In contrast, the full pixel density region 334 includes an even distribution of green emissive sub-pixels of both orientations. If care is not taken, this may result in a difference in off-axis color shift between full pixel density region 334 and pixel removal region 332. This may result in pixel removal region 332 having a different appearance than full pixel density region 334 at off-axis viewing angles.

Figure 15:
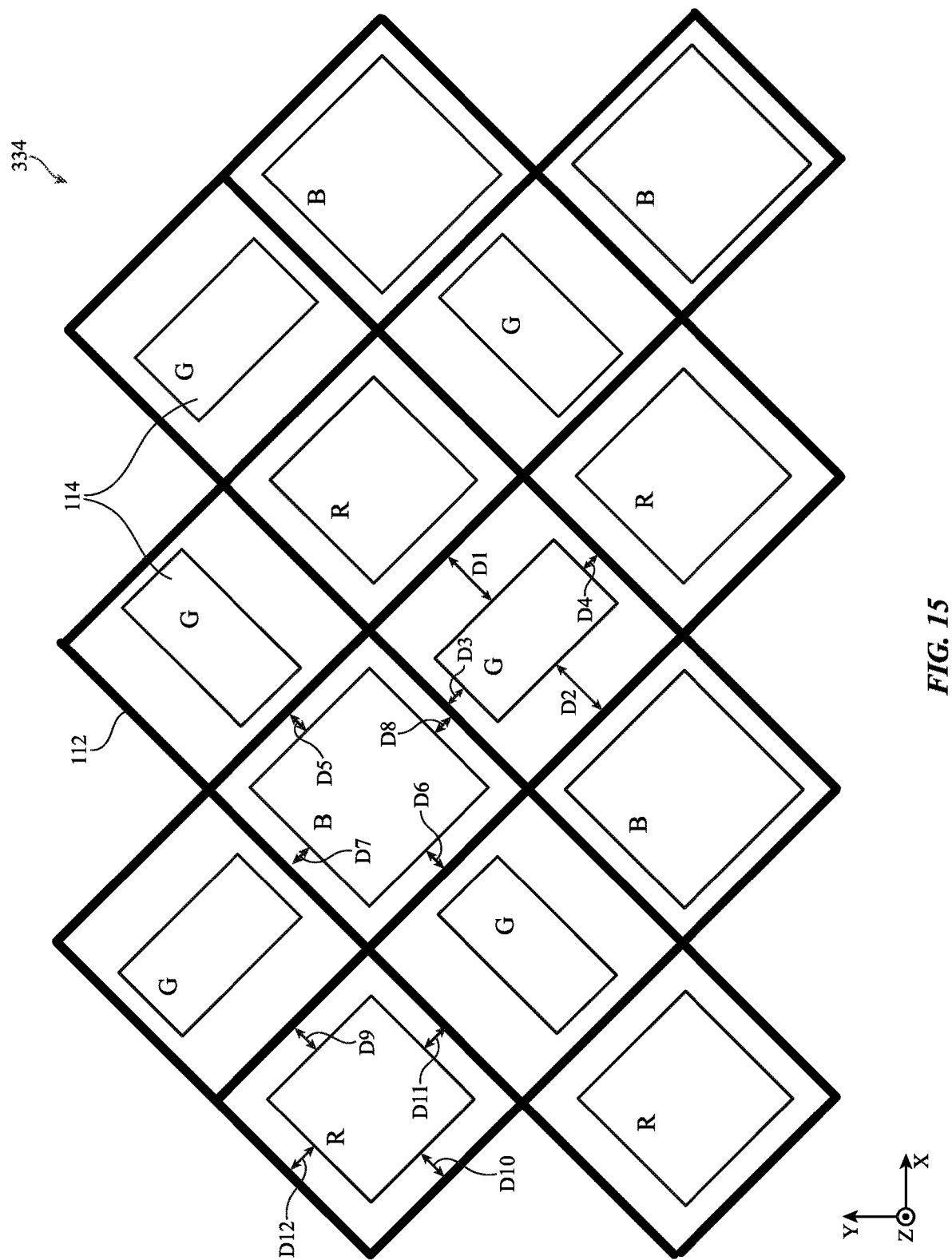
FIG. 15 is a top view of an illustrative full pixel density region showing the spacing of touch sensor metal in accordance with various embodiments.
Figure 16:
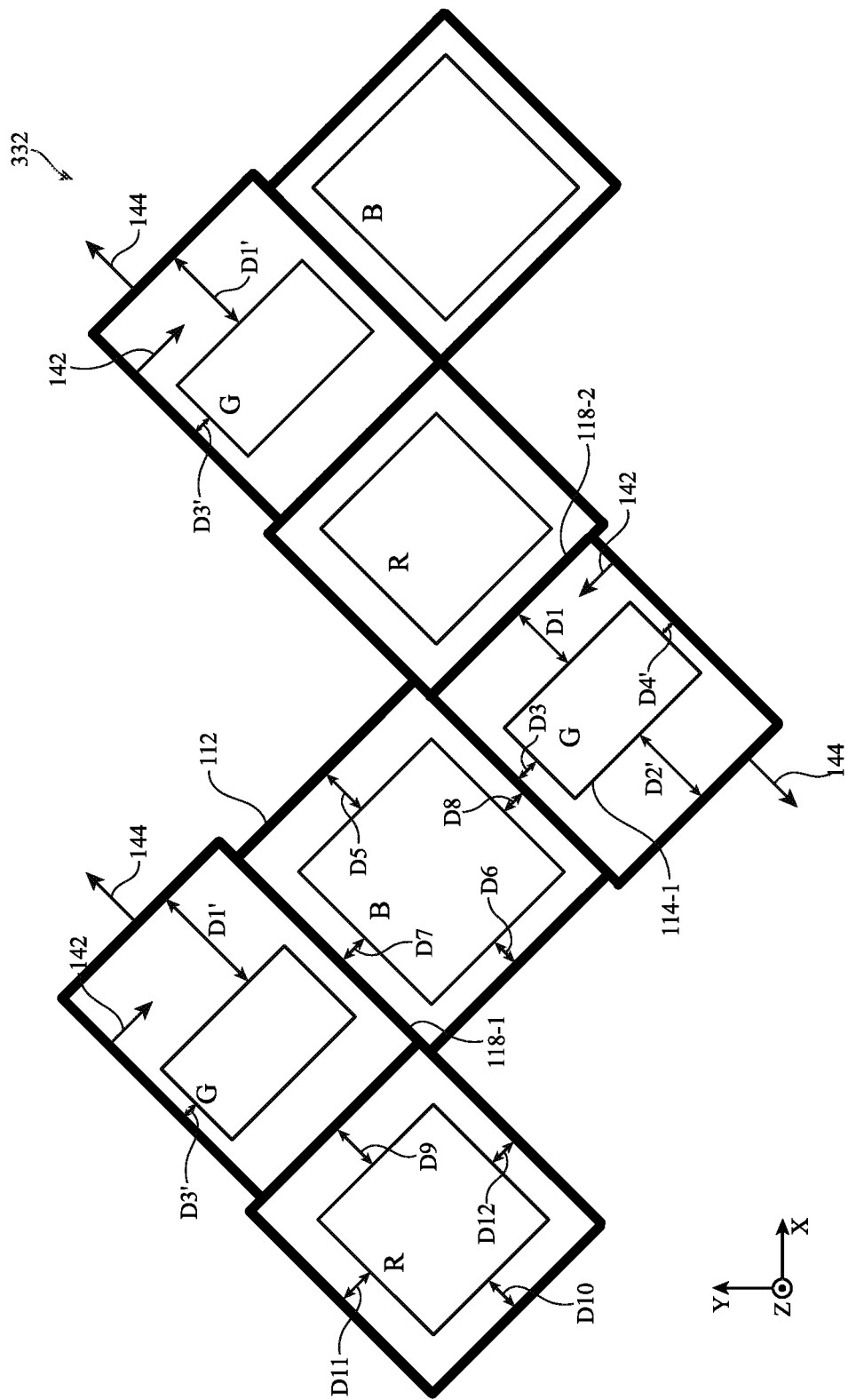
FIG. 16 is a top view of an illustrative pixel removal region showing how the spacing of touch sensor metal may be shifted to mitigate differences in off-axis color shift between the pixel removal region and the full pixel density region in accordance with various embodiments.
Figure 17:
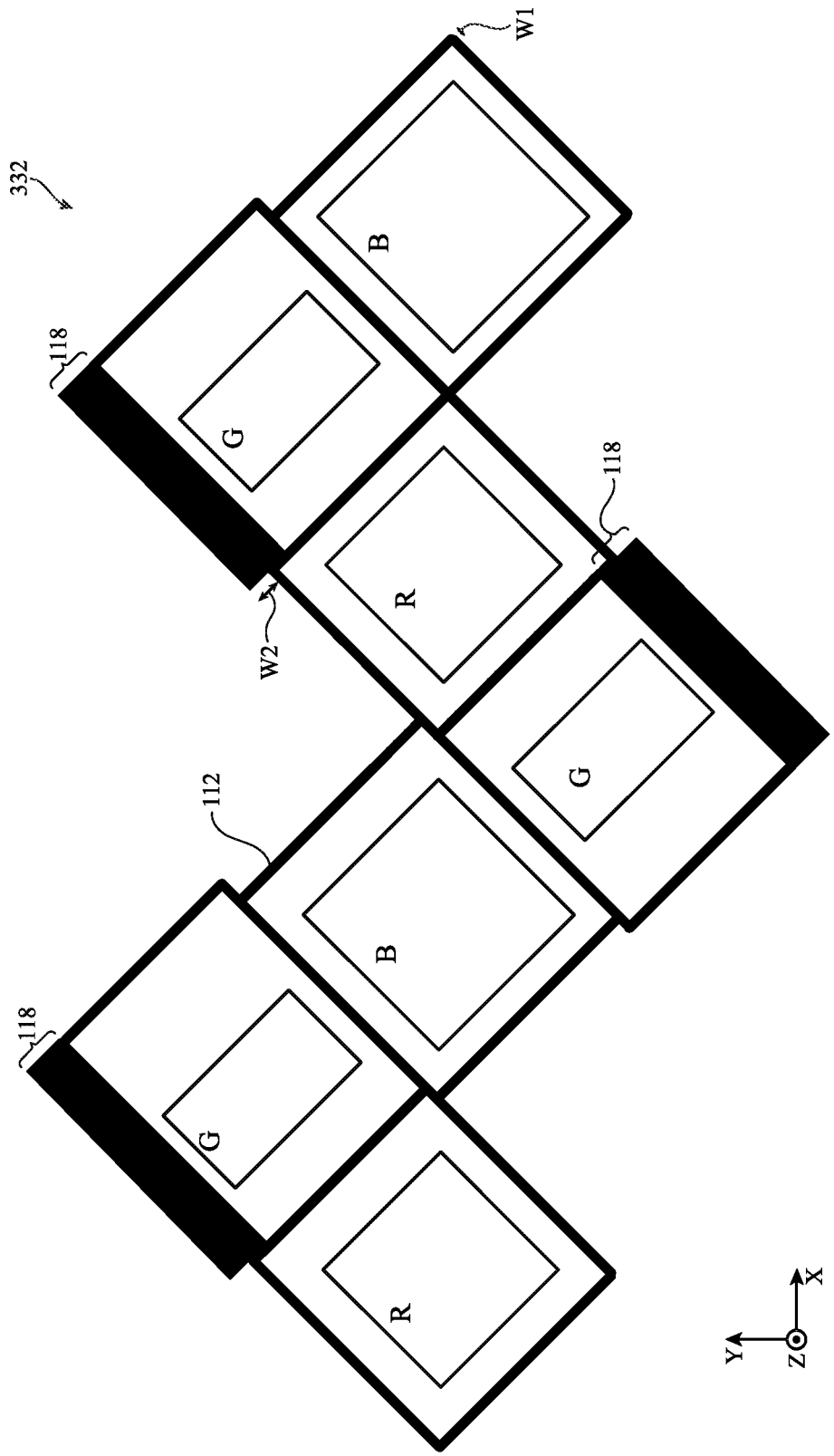
FIG. 17 is a top view of an illustrative pixel removal region with thick touch sensor metal segments to mitigate differences in off-axis color shift between the pixel removal region and the full pixel density region in accordance with various embodiments.

To mitigate a different appearance between pixel removal region 332 and full pixel density region 334 at off-axis viewing angles, the position of the touch sensor metal in pixel removal region 332 may be tuned. FIGS. 15-17 show examples of this type.

For reference, FIG. 15 shows the spacing between emissive sub-pixels and the touch sensor metal in full pixel density region 334 of the display. As shown, each emissive sub-pixel has four sides. Each side is adjacent to a respective segment of touch sensor electrode 114. As shown in FIG. 15, each green emissive sub-pixel has a first side separated from a respective touch sensor metal segment by distance D1, a second side separated from a respective touch sensor metal segment by distance D2, a third side separated from a respective touch sensor metal segment by distance D3, and a fourth side separated from a respective touch sensor metal segment by distance D4. Distances D1-D4 may have the same magnitudes or may have different magnitudes. Distances D1-D4 may be the same for each green emissive sub-pixel (in one possible arrangement). Alternatively, different green emissive sub-pixels may have different magnitudes for one or more of D1-D4.

As shown in FIG. 15, each blue emissive sub-pixel has a first side separated from a respective touch sensor metal segment by distance D5, a second side separated from a respective touch sensor metal segment by distance D6, a third side separated from a respective touch sensor metal segment by distance D7, and a fourth side separated from a respective touch sensor metal segment by distance D8. Distances D5-D8 may have the same magnitudes or may have different magnitudes. Distances D5-D8 may be the same for each blue emissive sub-pixel (in one possible arrangement). Alternatively, different blue emissive sub-pixels may have different magnitudes for one or more of D5-D8.

As shown in FIG. 15, each red emissive sub-pixel has a first side separated from a respective touch sensor metal segment by distance D9, a second side separated from a respective touch sensor metal segment by distance D10, a third side separated from a respective touch sensor metal segment by distance D11, and a fourth side separated from a respective touch sensor metal segment by distance D12. Distances D9-D12 may have the same magnitudes or may have different magnitudes. Distances D9-D12 may be the same for each red emissive sub-pixel (in one possible arrangement). Alternatively, different red emissive sub-pixels may have different magnitudes for one or more of D9-D12.

Each one of distances D1-D4 may be greater than 0.1 microns, greater than 0.5 microns, greater than 1 micron, greater than 2 microns, greater than 5 microns, greater than 10 microns, between 1 micron and 10 microns, less than 10 microns, less than 5 microns, etc.

To mitigate color differences between pixel removal region 332 and full pixel density region 334, the position of some of the touch sensor metal segments may be shifted in pixel removal region 332. FIG. 16 shows the spacing between emissive sub-pixels and the touch sensor metal in pixel removal region 332 of the display. In FIG. 16, some of the touch sensor metal segments are removed (similar to as in FIG. 10, for example). In addition, some of the touch sensor metal segments that are present in pixel removal region 332 are shifted relative to their position in full pixel density region 334 to mitigate color differences between pixel removal region 332 and full pixel density region 334.

As shown in FIG. 16, each blue emissive sub-pixel has a first side separated from a respective touch sensor metal segment by distance D5, a second side separated from a respective touch sensor metal segment by distance D6, a third side separated from a respective touch sensor metal segment by distance D7, and a fourth side separated from a respective touch sensor metal segment by distance D8. Distances D5-D8 may have the same magnitudes or may have different magnitudes. Distances D5-D8 may be the same for each blue emissive sub-pixel (in one possible arrangement). Alternatively, different blue emissive sub-pixels may have different magnitudes for one or more of D5-D8.

As shown in FIG. 16, each red emissive sub-pixel has a first side separated from a respective touch sensor metal segment by distance D9, a second side separated from a respective touch sensor metal segment by distance D10, a third side separated from a respective touch sensor metal segment by distance D11, and a fourth side separated from a respective touch sensor metal segment by distance D12. Distances D9-D12 may have the same magnitudes or may have different magnitudes. Distances D9-D12 may be the same for each red emissive sub-pixel (in one possible arrangement). Alternatively, different red emissive sub-pixels may have different magnitudes for one or more of D9-D12.

In other words, the relative spacing between the blue emissive sub-pixels and the red emissive sub-pixels and the touch sensor metal is the same in the pixel removal region as in the full pixel density region. However, the relative spacing between the green emissive sub-pixels and the touch sensor metal is different in the pixel removal region than in the full pixel density region.

Green emissive sub-pixels in FIG. 16 have four sides each adjacent to a respective touch sensor metal segment. The touch sensor metal segments that are interposed between adjacent emissive sub-pixels (e.g., segment 118-1 between a green emissive sub-pixel and a blue emissive sub-pixel or segment 118-2 between a green emissive sub-pixel and a red emissive sub-pixel) may have the same spacing relative to the sub-pixels in pixel removal region 332 as in full pixel density region 334. However, touch sensor metal segments that are adjacent to a green emissive sub-pixel but that are not interposed between adjacent emissive sub-pixels may be shifted in pixel removal region 332 relative to full pixel density region 334.

For example, consider green emissive sub-pixel 114-1 in FIG. 16. The green emissive sub-pixel has a first side separated from a respective touch sensor metal segment by distance D1, a second side separated from a respective touch sensor metal segment by distance D2', a third side separated from a respective touch sensor metal segment by distance D3, and a fourth side separated from a respective touch sensor metal segment by distance D4'. Distances D1 and D3 are the same in FIG. 16 (in the pixel removal region) as in FIG. 15 (in the full pixel density region). However, distances D2' and D4' in FIG. 16 have different magnitudes than distances D2 and D4 in FIG. 15. A first touch sensor metal segment that extends from the lower left to the upper right (e.g., orthogonal to the length of the emissive sub-pixel) is shifted in direction 142 (towards the green emissive sub-pixel) to result in a modified distance D4' between that segment and the emissive sub-pixel. A second touch sensor metal segment that extends from the upper left to the lower right (parallel to the length of the emissive sub-pixel) is shifted in direction 144 (away from the green emissive sub-pixel) to result in a modified distance D2' between that segment and the emissive sub-pixel. This shift technique may be applied to all of the green emissive sub-pixels at a lower portion of each zigzag row.

The green emissive sub-pixels at an upper portion of each zigzag row may have a similar adjustment. In particular, distances D1' and D3' in FIG. 16 have different magnitudes than distances D1 and D3 in FIG. 15. A first touch sensor metal segment that extends from the lower left to the upper right (e.g., orthogonal to the length of the emissive sub-pixel) is shifted in direction 142 (towards the green emissive sub-pixel) to result in a modified distance D3' between that segment and the emissive sub-pixel. A second touch sensor metal segment that extends from the upper left to the lower right (parallel to the length of the emissive sub-pixel) is shifted in direction 144 (away from the green emissive sub-pixel) to result in a modified distance D1' between that segment and the emissive sub-pixel.

To summarize, the touch sensor metal segments that are adjacent to the shorter side (e.g., parallel to the width and orthogonal to the length) of a green emissive sub-pixel without being interposed between adjacent emissive sub-pixels are shifted towards that green emissive sub-pixel. The touch sensor metal segments that are adjacent to the longer side (e.g., parallel to the length and orthogonal to the width) of a green emissive sub-pixel without being interposed between adjacent emissive sub-pixels are shifted away from that green emissive sub-pixel. This mitigates off-axis color shift between pixel removal region 332 and full pixel density region 334.

Each shift amount (e.g., the difference between D1 in region 334 and D1' in region 332, the difference between D2 in region 334 and D2' in region 332, the difference between D3 in region 334 and D3' in region 332, and the difference between D4 in region 334 and D4' in region 332) may have any desired magnitude (e.g., greater than 0.1 microns, greater than 0.5 microns, greater than 1 micron, greater than 2 microns, greater than 5 microns, between 0.1 micron and 2 microns, less than 2 microns, less than 5 microns, between 1 micron and 3 microns, etc.

In one possible arrangement, the difference between D3 and D3' is the same as the difference between D4 and D4' (since these are both shifts towards the emissive sub-pixel) and the difference between D2 and D2' is the same as the difference between D1 and D1' (since these are both shifts away from the emissive sub-pixel).

In addition to shifting some of the touch sensor metal segments (as in FIG. 16), the touch sensor electrode may include some touch sensor metal segments that are wider than others to mitigate off-axis color shift between pixel removal region 332 and full pixel density region 334. FIG. 17 is a top view of a pixel removal region with wide touch sensor metal segments of this type. As shown in FIG. 17, each touch sensor metal segment 118 has an increased width relative to the rest of the touch sensor metal segments (and relative to the corresponding touch sensor metal segments in the full pixel density region as in FIG. 15). The wide touch sensor metal segments 118 are adjacent to the shorter side (e.g., parallel to the width and orthogonal to the length) of a green emissive sub-pixel without being interposed between adjacent emissive sub-pixels. Each touch sensor metal segment 118 in this position may have an increased width W2. The remaining touch sensor metal segments in pixel removal region 332 have a width W1. All of the touch sensor metal segments in the full pixel density region 334 may have the width W1.

The difference between widths W1 and W2 may have any desired magnitude (e.g., greater than 0.1 microns, greater than 0.5 microns, greater than 1 micron, greater than 2 microns, greater than 5 microns, between 0.1 micron and 2 microns, less than 2 microns, less than 5 microns, between 1 micron and 3 microns, between 1 micron and 2 microns, etc.). The magnitude of W1 may be greater than 2 microns, greater than 3 microns, greater than 5 microns, less than 10 microns, less than 5 microns, less than 3 microns, between 2 microns and 4 microns, etc. The magnitude of W2 may be greater than 1 micron, greater than 2 microns, greater than 3 microns, greater than 4 microns, less than 5 microns, less than 10 microns, less than 3 microns, between 4 microns and 5 microns, etc.

FIGS. 16 and 17 show examples where the position of the touch sensor metal in pixel removal region 332 is tuned to mitigate a different appearance between pixel removal region 332 and full pixel density region 334 at off-axis viewing angles. It should further be noted that the position of the touch sensor metal in pixel removal region 332 and/or full pixel density region 334 may be tuned may be tuned to reduce color asymmetry induced by anode tilt in the pixels.

One or more of the techniques for reducing the amount touch sensor metal in pixel removal region 332 (as in FIGS. 9-13) may be combined with one or more of the techniques for mitigating off-axis color shift between regions 332 and 334 (as in FIGS. 16 and 17). Additionally, any of the aforementioned techniques may be applied to any display portion that overlaps an input-output component (regardless of the arrangement of the display pixels over the input-output component, whether or not the display has a reduced pixel density over the input-output component, etc.).

Figure 18A:
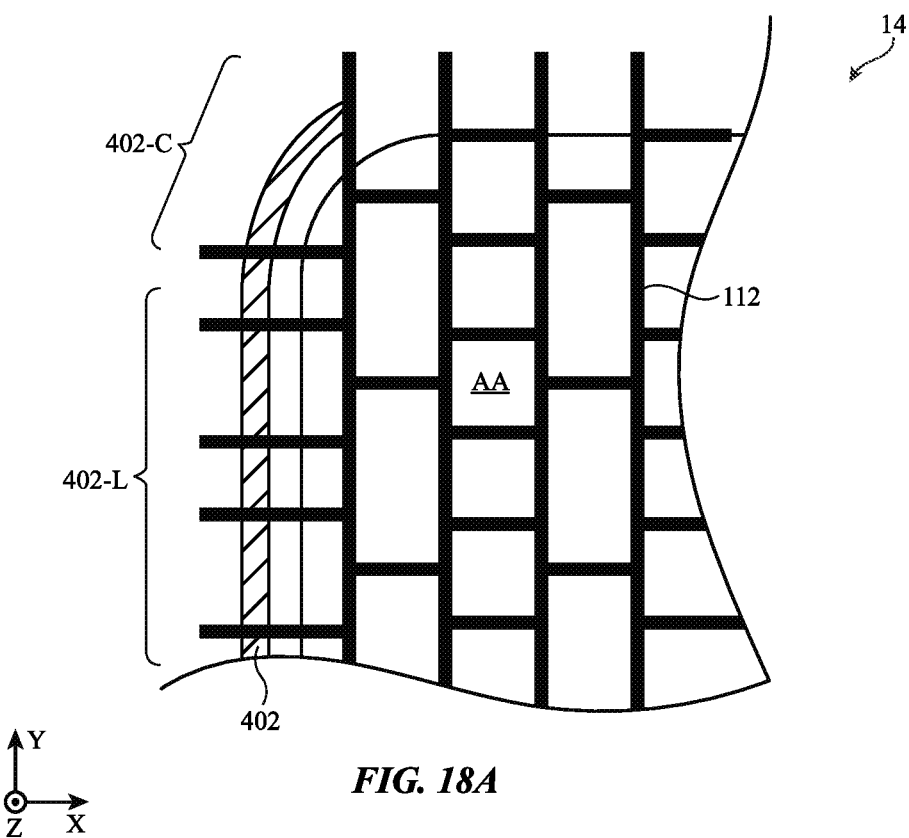
FIG. 18A is a top view of an illustrative display with a signal line adjacent to an array of pixels in accordance with various embodiments.

Instead of or in addition to including the aforementioned touch sensor metal concepts (e.g., reducing touch sensor metal in the pixel removal region and/or tuning the touch sensor metal spacing), an additional touch sensor metal patch may be included in the touch sensor metal to block a reflective structure underneath the display. FIG. 18A is a top view of an illustrative display with touch sensor metal. As shown in FIG. 18A, display 14 includes an active area (AA) with display pixels 22 (as shown in FIG. 2, for example) and an inactive area without display pixels that emit light for the display. A signal line such as signal line 402 may be included in the inactive area of the display. Signal line 402 may provide a signal (e.g., an initialization voltage) to the pixels 22 within the active area AA. Signal line 402 has a linear portion 402-L that extends vertically along a left side of the active area and a curved portion 402-C that extends from the linear portion around a rounded corner of the active area.

FIG. 18A also shows how touch sensor metal 112 is arranged in a repeating pattern over the display. The touch sensor metal may have portions that overlap the active area (AA) and portions that overlap the inactive area of the display.

Figure 18B:
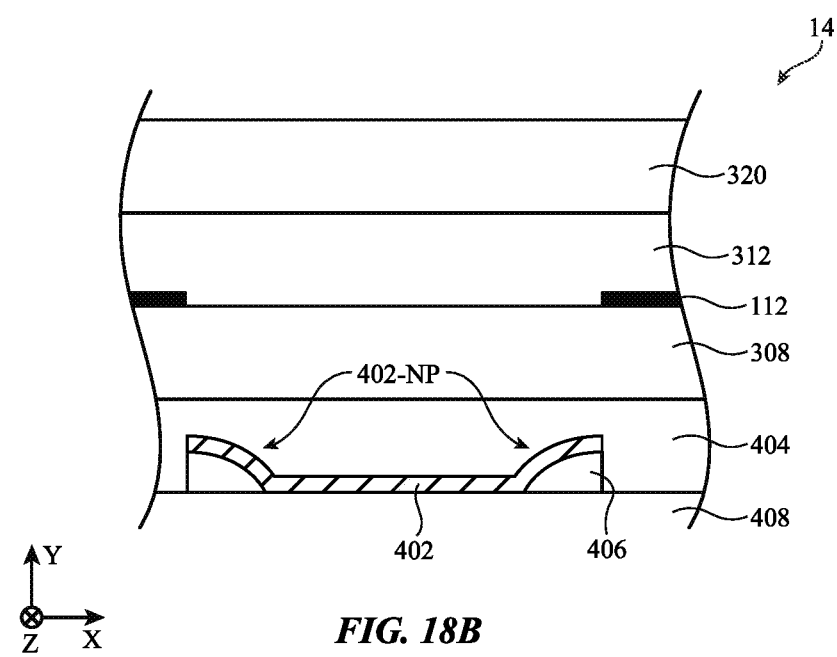
FIG. 18B is a cross-sectional side view of the illustrative display of FIG. 18A in accordance with various embodiments.

FIG. 18B is a cross-sectional side view of the display of FIG. 18A showing signal line 402. Signal line 402 may be formed on a substrate 408 and/or planarization layers 406. One or more planarization layers 404 is formed over the signal line. The signal line is also covered by encapsulation layer(s) 308, polarizer 312, and display cover layer 320. In this example, touch sensor metal 112 is interposed between polarizer 312 and encapsulation layer(s) 308. In FIGS. 18A and 18B, touch sensor metal 112 has little to no overlap with signal line 402.

Signal line 402 may be formed from a reflective material (e.g., having a reflectance that is greater than 60%, greater than 80%, greater than 90%, greater than 95%, etc.). Reflections from planar portions of signal line 402 (e.g., portions parallel to the XY-plane) may be blocked by polarizer 312. However, signal line 402 has non-planar portions 402-NP due to the geometry of underlying planarization layers 406. The non-planar portions 402-NP may cause reflections that are not blocked by polarizer 312. This may cause the display to have a bright line overlapping the footprint of signal line 402 when viewed by a viewer in bright ambient light conditions.

Figure 19A:
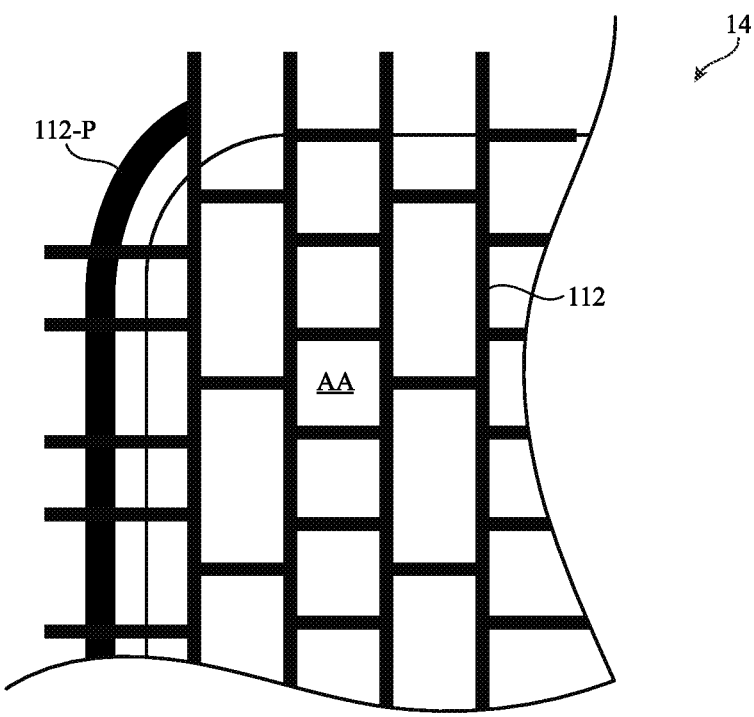
FIG. 19A is a top view of an illustrative display with a planar touch sensor metal patch that overlaps a non-planar signal line in accordance with various embodiments.
Figure 19B:
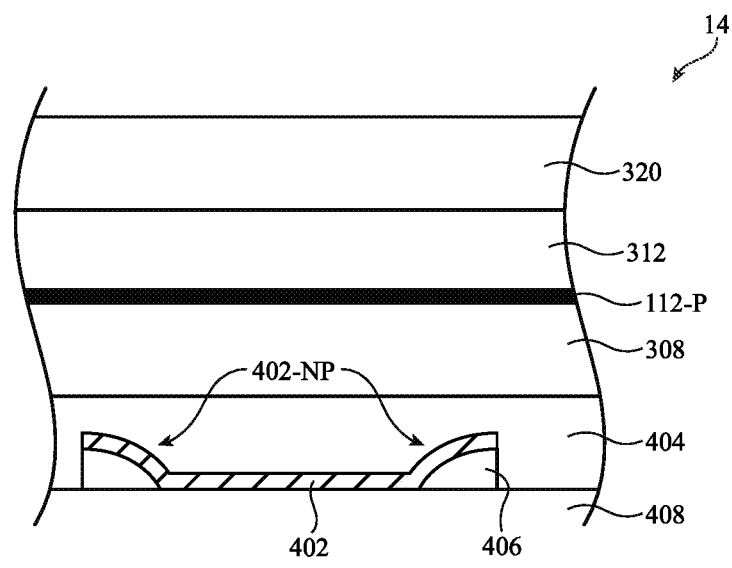
FIG. 19B is a cross-sectional side view of the illustrative display of FIG. 19A in accordance with various embodiments.

As shown in FIGS. 19A and 19B, to mitigate reflections of this type, the touch sensor metal 112 may include a patch 112-P in addition to the repeating pattern from FIG. 18A. Patch 112-P in FIG. 19A may have a footprint that overlaps (is aligned with) signal line 402. The patch may have a linear portion that extends vertically along a left side of the active area (to overlap linear portion 402-L of signal line 402) and a curved portion that extends from the linear portion around a rounded corner of the active area (to overlap curved portion 402-C of signal line 402).

As shown in FIG. 19B, touch sensor metal patch 112-P overlaps signal line 402. Ambient light therefore reflects off of the planar touch sensor metal patch 112-P (instead of the non-planar portions of the signal line 402) and are blocked by polarizer 312. Touch sensor metal patch 112-P is electrically connected to (and formed during the same manufacturing step as) the repeating pattern portion of the touch sensor metal.

In the repeating pattern portion of the touch sensor metal 112 (e.g., the grid shown in FIG. 18A), each segment of touch sensor metal may have a first width that is less than 10 microns, less than 5 microns, less than 3 microns, greater than 1 micron, between 1 micron and 10 microns, between 2 microns and 5 microns, etc. The patch 112-P may have a second width that is greater than 10 microns, greater than 20 microns, greater than 30 microns, greater than 50 microns, less than 50 microns, between 20 microns and 30 microns, etc. The second width may be at least 50% greater than the first width, at least two times greater than the first width, at least five times greater than the first width, at least ten times greater than the first width, etc.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   an input-output component; and
   a display having an array of pixels, wherein the display has:
      a first portion that includes first touch sensor metal, wherein the first touch sensor metal includes a plurality of segments having a first width; and
      a second portion that includes second touch sensor metal, wherein the second portion overlaps the input-output component, wherein the second touch sensor metal has a different arrangement than the first touch sensor metal, wherein the second touch sensor metal includes a second plurality of segments, wherein each segment of a first subset of the second plurality of segments has a second width that is less than the first width, and wherein each segment of a second subset of the second plurality of segments has the first width.

2. The electronic device defined in claim 1, wherein each segment of the second subset of the second plurality of segments is directly adjacent to a side of a pixel in the array of pixels.

3. The electronic device defined in claim 2, wherein each segment of the first subset of the second plurality of segments is not directly adjacent to a side of any pixel in the array of pixels.

4. The electronic device defined in claim 1, wherein the first touch sensor metal forms a first mesh that defines a first plurality of openings and wherein each one of the first plurality of openings overlaps a respective pixel in the array of pixels.

5. The electronic device defined in claim 4, wherein the second touch sensor metal forms a second mesh that defines a second plurality of openings, wherein each opening of a first subset of the second plurality of openings overlaps a respective pixel in the array of pixels, and wherein each opening of a second subset of the second plurality of openings does not overlap a respective pixel in the array of pixels.

6. The electronic device defined in claim 1, wherein the first touch sensor metal forms a first mesh that defines a first plurality of openings and wherein each one of the first plurality of openings overlaps a respective pixel in the array of pixels.

7. The electronic device defined in claim 6, wherein the second touch sensor metal has omitted segments relative to the first touch sensor metal.

8. The electronic device defined in claim 6, wherein the second touch sensor metal has portions that each form a mesh that defines a respective plurality of openings, wherein each opening in each respective plurality of openings overlaps a respective pixel in the array of pixels, and wherein the second touch sensor metal includes connecting segments that electrically connect adjacent portions.

9. The electronic device defined in claim 8, wherein the second touch sensor metal includes, for each row of pixels in the second portion, one connecting segment for each group of four pixels.

10. The electronic device defined in claim 1, wherein, in the first touch sensor metal, a first touch sensor metal segment is directly adjacent to a first side of a first pixel of a first color, wherein, in the second touch sensor metal, a second touch sensor metal segment is directly adjacent to a second side of a second pixel of the first color, wherein the first touch sensor metal segment is separated from the first side of the first pixel by a first distance, and wherein the second touch sensor metal segment is separated from the second side of the second pixel by a second distance that is different than the first distance.

11. The electronic device defined in claim 1, wherein the first touch sensor metal defines a first number of openings per unit area, wherein the second touch sensor metal defines a second number of openings per unit area, and wherein the second number of openings per unit area is less than the first number of openings per unit area.

12. The electronic device defined in claim 1, wherein the first touch sensor metal has a first total coverage per unit area and wherein the second touch sensor metal has a second total coverage per unit area that is lower than the first total coverage per unit area.

13. The electronic device defined in claim 1, wherein the first portion of the display has a first pixel density and wherein the second portion of the display has a second pixel density that is lower than the first pixel density.

14. The electronic device defined in claim 1, further comprising:
 a signal line having at least one non-planar portion that is adjacent to the array of pixels; and
 a planar touch sensor metal patch that overlaps the signal line.

15. An electronic device, comprising:
 an input-output component; and
 a display having an array of pixels, wherein the display has:
  a first portion that includes first touch sensor metal; and
  a second portion that includes second touch sensor metal, wherein the second portion overlaps the input-output component, wherein, in the first touch sensor metal, a first touch sensor metal segment is directly adjacent to a first side of a first pixel of a first color, wherein, in the second touch sensor metal, a second touch sensor metal segment is directly adjacent to a second side of a second pixel of the first color, wherein the first touch sensor metal segment is separated from the first side of the first pixel by a first distance, and wherein the second touch sensor metal segment is separated from the second side of the second pixel by a second distance that is different than the first distance.

16. The electronic device defined in claim 15, wherein the first pixel has a third side that is orthogonal to the first side and that is longer than the first side, wherein the second pixel has a fourth side that is orthogonal to the second side and that is longer than the second side, and wherein the second distance is smaller than the first distance.

17. The electronic device defined in claim 15, wherein the first pixel has a third side that is orthogonal to the first side and that is shorter than the first side, wherein the second pixel has a fourth side that is orthogonal to the second side and that is shorter than the second side, and wherein the second distance is greater than the first distance.

18. The electronic device defined in claim 15, wherein, in the first touch sensor metal, a third touch sensor metal segment is directly adjacent to a third side of the first pixel, wherein, in the second touch sensor metal, a fourth touch sensor metal segment is directly adjacent to a fourth side of the second pixel, wherein the third touch sensor metal segment has a first width, and wherein the fourth touch sensor metal segment has a second width that is greater than the first width.

19. The electronic device defined in claim 15, wherein the second pixel has a third side that is orthogonal to the second side, wherein the second touch sensor metal has a third touch sensor metal segment that is directly adjacent to the third side, wherein the third touch sensor metal segment is separated from the third side of the second pixel by a third distance that is different than the second distance.

20. The electronic device defined in claim 15, wherein the second touch sensor metal segment is interposed between the second pixel and a third pixel, wherein the second touch sensor metal segment is separated from a third side of the third pixel by a third distance, and wherein the second distance is smaller than the third distance.

21. An electronic device comprising a display, wherein the display comprises:
 an array of pixels arranged in a first area;
 a signal line in a second area that is adjacent to the first area; and
 touch sensor metal having a first portion arranged in a repeating pattern over the first area and a second portion that forms a patch that overlaps the signal line in the second area.

22. The electronic device defined in claim 21, wherein the repeating pattern comprises a repeating grid of segments, wherein each segment has a first width, and wherein the patch has a second width that is at least five times greater than the first width.

23. The electronic device defined in claim 21, wherein the first area is an active area and wherein the second area is an inactive area.

24. The electronic device defined in claim 21, wherein the signal line has at least one non-planar portion and wherein the patch is a planar patch that overlaps the signal line.

25. The electronic device defined in claim 21, wherein the signal line has a first footprint and wherein the patch has a second footprint that matches the first footprint.

26. An electronic device, comprising:
 an input-output component; and
 a display having an array of pixels, wherein the display has:
  a portion that overlaps the input-output component, wherein the portion includes touch sensor metal, wherein the touch sensor metal comprises:
   a first touch sensor metal segment that is directly adjacent to a first side of a pixel, wherein the first side has a first length, and wherein the first touch sensor metal segment has a first width; and
   a second touch sensor metal segment that is directly adjacent to a second side of the pixel, wherein the second side is orthogonal to the first side, wherein the second side has a second length, wherein the first length is smaller than the second length, wherein the second touch sensor metal segment has a second width, and wherein the first width is greater than the second width.

* * * * *